(12) United States Patent
Xie et al.

(10) Patent No.: US 12,356,711 B2
(45) Date of Patent: Jul. 8, 2025

(54) LATE GATE EXTENSION

(71) Applicant: International Business Machines Corporation, Armonk, NY (US)

(72) Inventors: Ruilong Xie, Niskayuna, NY (US); Christopher J Waskiewicz, Rexford, NY (US); Jay William Strane, Warwick, NY (US); Hemanth Jagannathan, Niskayuna, NY (US); Brent Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 740 days.

(21) Appl. No.: 17/514,545

(22) Filed: Oct. 29, 2021

(65) Prior Publication Data

US 2023/0139379 A1    May 4, 2023

(51) Int. Cl.
*H10D 84/85* (2025.01)
*H10D 30/01* (2025.01)
*H10D 30/62* (2025.01)
*H10D 30/63* (2025.01)
*H10D 62/13* (2025.01)
*H10D 84/01* (2025.01)
*H10D 84/03* (2025.01)

(52) U.S. Cl.
CPC ......... *H10D 84/853* (2025.01); *H10D 30/024* (2025.01); *H10D 30/6211* (2025.01); *H10D 30/63* (2025.01); *H10D 62/151* (2025.01); *H10D 84/013* (2025.01); *H10D 84/0147* (2025.01); *H10D 84/0158* (2025.01); *H10D 84/038* (2025.01)

(58) Field of Classification Search
CPC .. H10D 30/63; H10D 30/6728; H10D 30/025; H10D 84/016
See application file for complete search history.

(56) References Cited

U.S. PATENT DOCUMENTS

| | | |
|---|---|---|
| 7,972,966 B2 | 7/2011 | Breitwisch et al. |
| 9,530,863 B1 | 12/2016 | Zhang et al. |
| 9,761,491 B1 | 9/2017 | Huang et al. |
| 9,773,708 B1 | 9/2017 | Zhang et al. |
| 9,780,088 B1 * | 10/2017 | Balakrishnan ....... H10D 30/025 |
| 9,960,254 B1 | 5/2018 | Bao et al. |
| 10,014,391 B2 | 7/2018 | Bergendahl et al. |
| 10,037,919 B1 | 7/2018 | Xie et al. |
| 10,103,247 B1 | 10/2018 | Xie et al. |
| 10,176,997 B1 | 1/2019 | De Silva et al. |

(Continued)

*Primary Examiner* — Syed I Gheyas
(74) *Attorney, Agent, or Firm* — Michael A. Petrocelli

(57) ABSTRACT

VFET devices having a robust gate extension structure using late gate extension patterning and self-aligned gate and source/drain region contacts are provided. In one aspect, a VFET device includes: at least one bottom source/drain region present on a substrate; at least one fin disposed on the at least one bottom source/drain region, wherein the at least one fin serves as a vertical fin channel of the VFET device; a gate stack alongside the at least one fin; a gate extension metal adjacent to the gate stack at a base of the at least one fin; a barrier layer that separates the gate extension metal from the gate stack; and at least one top source/drain region at a top of the at least one fin. A VFET device that includes multiple VFETs present on a substrate, and a method of forming a VFET device are also provided.

18 Claims, 24 Drawing Sheets

(56) References Cited

U.S. PATENT DOCUMENTS

| | | | |
|---|---|---|---|
| 10,461,174 B1 | 10/2019 | Chi et al. | |
| 2019/0051563 A1 | 2/2019 | Park et al. | |
| 2019/0051659 A1* | 2/2019 | Xie | H10D 84/0177 |
| 2019/0319116 A1* | 10/2019 | Lee | H01L 21/30604 |

* cited by examiner

LATE GATE EXTENSION

FIELD OF THE INVENTION

The present invention relates to vertical field-effect transistor (VFET) devices, and more particularly, to VFET devices having a robust gate extension structure with self-aligned gate and source/drain region contacts, and techniques for fabrication thereof using late gate extension patterning.

BACKGROUND OF THE INVENTION

As opposed to planar complementary metal-oxide-semiconductor (CMOS) devices, vertical transport field effect transistor (VFET) devices are oriented with vertical fin channels disposed on a bottom source/drain and a top source/drain disposed on the fin channels. VFET devices are being pursued as a viable device option for continued CMOS scaling.

There are, however, notable challenges associated with implementing a VFET device design. For instance, with conventional approaches, care must be taken to preserve the gate structure in between the vertical fin channels, since this is where the gate contacts are formed. If the gate structure between the vertical fin channels is inadvertently removed, there will be no place to access the gates.

Preserving the gate structure in between ends of the vertical fin channels at highly scaled dimensions can require a very small pattern to cover the gate extension region in order to precisely preserve the gate metal in wanted areas, and there is a high risk of having pattern collapse when the lithography soft mask, such as organic planarizing layer (OPL), is etched due to high aspect ratio.

Therefore, improved techniques for VFET device fabrication which provide for a robust gate extension structure without the above-described concerns associated with without pattern collapse would be desirable.

SUMMARY OF THE INVENTION

The present invention provides vertical field-effect transistor (VFET) devices having a robust gate extension structure using late gate extension patterning and self-aligned gate and source/drain region contacts. In one aspect of the invention, a VFET device is provided. The VFET device includes: at least one bottom source/drain region present on a substrate; at least one fin disposed on the at least one bottom source/drain region, wherein the at least one fin serves as a vertical fin channel of the VFET device; a gate stack alongside the at least one fin; a gate extension metal adjacent to the gate stack at a base of the at least one fin; a barrier layer that separates the gate extension metal from the gate stack; and at least one top source/drain region at a top of the at least one fin.

In another aspect of the invention, another VFET device is provided. The VFET device includes multiple VFETs present on a substrate, each VFET having: a bottom source/drain region present on the substrate; a fin disposed on the bottom source/drain region, wherein the fin serves as a vertical fin channel of the VFET; a gate stack alongside the fin; a gate extension metal adjacent to the gate stack at a base of the fin; a barrier layer that separates the gate extension metal from the gate stack, wherein the barrier layer includes a material selected from the group consisting of: titanium (Ti), tantalum (Ta), titanium nitride (TiN), tantalum nitride (TaN), and combinations thereof; and a top source/drain region at a top of the fin.

In yet another aspect of the invention, a method of forming a VFET device is provided. The method includes: patterning fins in a substrate, wherein the fins serve as vertical fin channels of the VFET device; forming bottom source/drain regions in the substrate beneath the fins; forming a gate stack alongside the fins, wherein the gate stack includes a gate dielectric disposed along sidewalls of the fins, and at least one workfunction-setting metal disposed on the gate dielectric; depositing sidewall spacers that cover ends of the at least one workfunction-setting metal at a base of the fins; removing the sidewall spacers in between the fins; depositing a barrier layer in between the fins; forming a gate extension metal in between the fins over the barrier layer; and forming top source/drain regions at a top of the fins.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for vertical field-effect transistor (VFET) device fabrication having a robust gate extension structure. As will be described in detail below, the present gate extension structure is formed using late gate extension patterning whereby, instead of trying to preserve the gate structure in between the vertical fin channels, a late gate extension patterning is performed followed by the placement of a gate extension metal in between the vertical fin channels. Thus, the need to preserve the early gate structure in between the vertical fin channels as in conventional process flows (see above) is avoided altogether. Further, the present techniques enable the formation of self-aligned gate contacts in between the vertical fin channels, and self-aligned source/drain region contacts.

Figure 1:
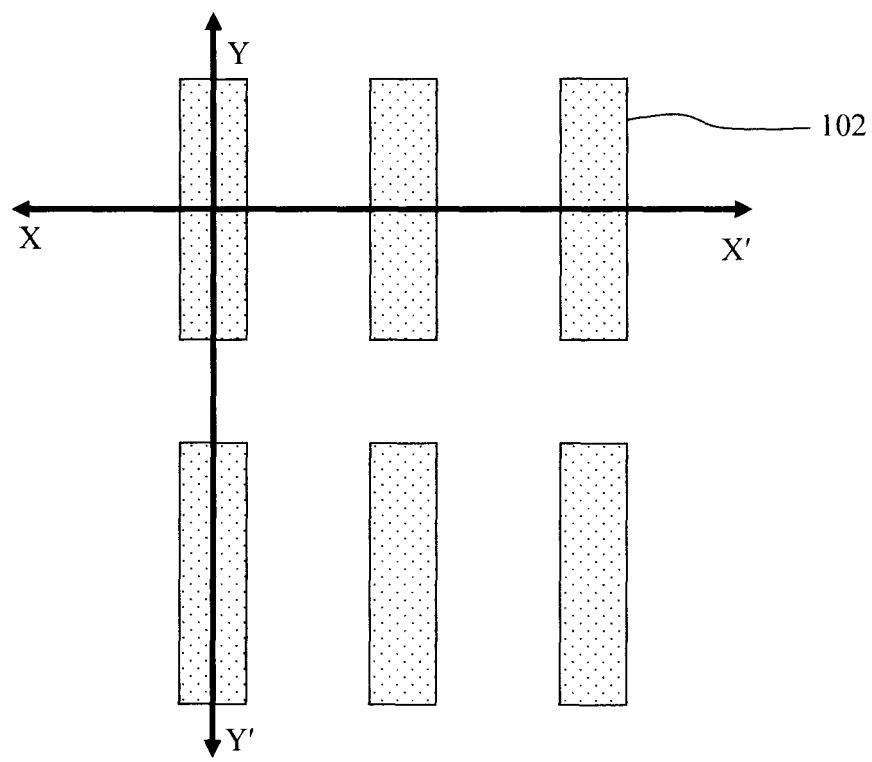
FIG. 1 is a top-down diagram illustrating an orientation of the X-X' and Y-Y' cross-sectional views shown in the figures according to an embodiment of the present invention.

Given the above overview, an exemplary methodology for forming a VFET device in accordance with the present techniques is now described by way of reference to FIGS. 1-26. FIG. 1 is a top-down diagram illustrating an orientation of the cross-sectional views that will be shown in the figures that follow. Namely, as shown in FIG. 1, according to an exemplary embodiment, the present VFET device includes a plurality of fins 102 oriented adjacent to one another along a first direction (in this case along an X-direction). Fins 102 are aligned with one another along a second direction (in this case along a Y-direction) which is perpendicular to the first/X-direction.

The X-X' cross-sectional views that will be shown in the figures that follow depict cuts through multiple fins 102. The Y-Y' cross-sectional views that will be shown in the figures that follow depict cuts along two of the (aligned) fins 102. It is notable that the other structures present in the VFET device have been omitted for clarity in order to best illustrate the orientation of the X-X' and Y-Y' cross-sectional views.

Figure 2:
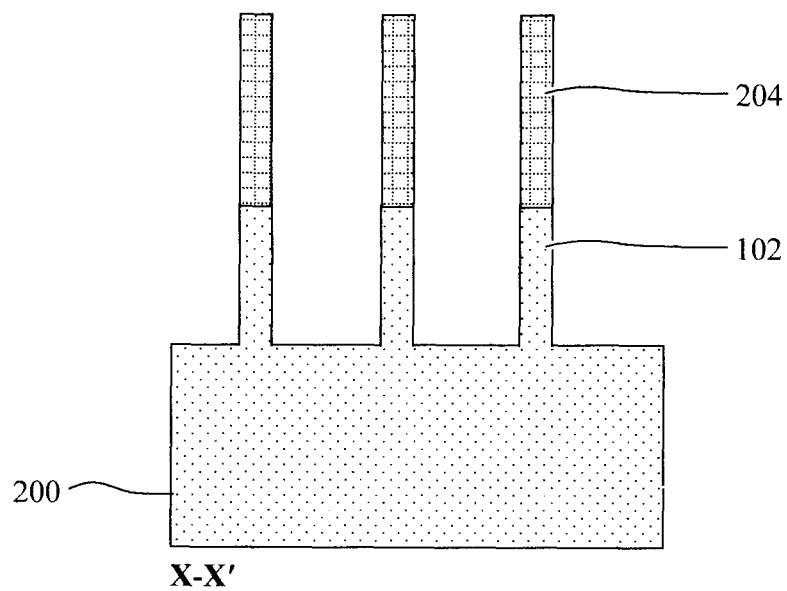
FIG. 2 is an X-X' cross-sectional view illustrating a fin hardmask having been used to pattern fins in a substrate according to an embodiment of the present invention.
Figure 3:
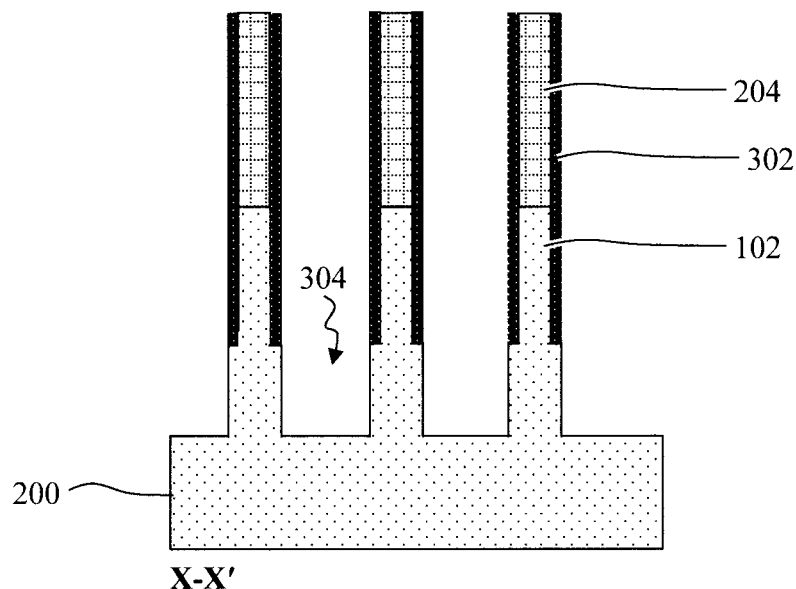
FIG. 3 is an X-X' cross-sectional view illustrating a sacrificial liner having been formed along sidewalls of the fins and fin hardmask, and an etch having been performed to recess the substrate in between the sacrificial liner thereby forming cavities at the base of the fins according to an embodiment of the present invention.

Referring to FIG. 2 (an X-X' cross-sectional view), the process begins with the patterning of the fins 102 in a substrate 200. Fins 102 will serve as the vertical fin channels of the VFET device. According to an exemplary embodiment, substrate 200 is a bulk semiconductor wafer, such as a bulk silicon (Si), bulk germanium (Ge), bulk silicon germanium (SiGe) and/or bulk III-V semiconductor wafer. Alternatively, substrate 200 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, substrate 200 may already have pre-built structures (not shown) such as transistors, diodes, capacitors, resistors, interconnects, wiring, etc.

Standard lithography and etching techniques can be employed to pattern the fins 102 in substrate 200. With standard lithography and etching techniques, a lithographic stack (not shown), e.g., photoresist/anti-reflective coating (ARC)/organic planarizing layer (OPL), is used to pattern a fin hardmask 204 with the footprint and location of each of the features to be patterned in the underlying substrate (in this case the fins 102). Suitable fin hardmask materials include, but are not limited to, oxide hardmask materials such as silicon oxide (SiOx) and/or nitride hardmask materials such as silicon nitride (SiN), silicon oxynitride (SiON) and/or silicon carbide nitride (SiCN). Alternatively, advanced lithography patterning techniques such as self-aligned double patterning (SADP) and self-aligned quadruple patterning (SAQP) can be used to define the fins 102 at small fin size and at very small fin pitch. An etch is then performed to transfer the pattern from the fin hardmask 204 to the underlying substrate 200 to form the fins 102 shown in FIG. 2.

Bottom source/drain regions are then formed at the base of the fins 102. To do so, a sacrificial liner 302 is first formed along the sidewalls of the fins 102 and fin hardmask 204. See FIG. 3 (an X-X' cross-sectional view). The term 'sacrificial' as used herein generally refers to a structure that is removed, in whole or in part, during fabrication. Suitable sacrificial liner materials include, but are not limited to, nitride materials such as SiN, SiON and/or SiCN which can be deposited over the fins 102 and fin hardmask 204 using a process such as chemical vapor deposition (CVD), atomic layer deposition (ALD) or physical vapor deposition (PVD). A directional (i.e., anisotropic) etching process such as reactive ion etching (RIE) can then be employed to remove the sacrificial liner material from horizontal surfaces, thereby forming the sacrificial liner 302 on the sidewalls of the fins 102 and fin hardmask 204.

Figure 4:
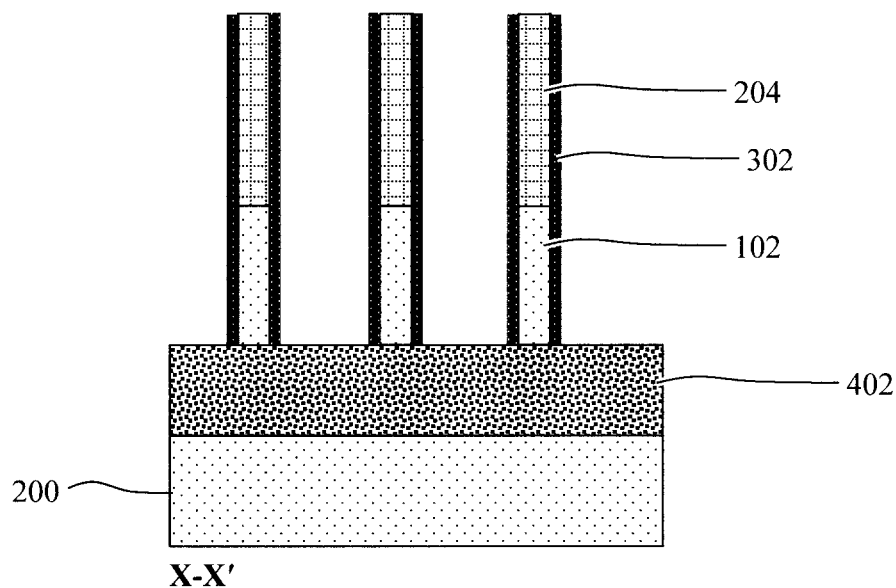
FIG. 4 is an X-X' cross-sectional view illustrating a doped epitaxial material having been grown in the cavities followed by a dopant diffusion anneal to form bottom source/drain regions beneath the fins according to an embodiment of the present invention.

An etch (e.g., using RIE) is then performed to recess the substrate 200 between the sacrificial liner 302, forming cavities 304 at the base of the fins 102. The sacrificial liner 302 protects the fins 102 and fin hardmask 204 during this recess etch. An in-situ doped (i.e., where a dopant(s) is introduced during growth) or ex-situ doped (e.g., where a dopant(s) is introduced by ion implantation) epitaxial material such as epitaxial Si, epitaxial SiGe, etc. is then grown in the cavities 304 followed by an anneal to diffuse dopants from the epitaxial material into the base of the fins 102, thereby forming bottom source/drain regions 402 beneath the fins 102. See FIG. 4 (an X-X' cross-sectional view). Suitable n-type dopants include, but are not limited to, phosphorous (P) and/or arsenic (As). Suitable p-type dopants include, but are not limited to, boron (B). Following formation of the bottom source/drain regions 402, the sacrificial liner 302 can be removed. As shown in FIG. 4, the fins 102 are now disposed on the bottom source/drain regions 402.

Shallow trench isolation (STI) regions 502 are next formed in the bottom source/drain regions 402 and substrate 200 in between adjacent devices, and bottom spacers 504 are formed on the bottom source/drain regions 402 and STI regions 502. See FIG. 5A (an X-X' cross-sectional view) and FIG. 5B (a Y-Y' cross-sectional view). According to an exemplary embodiment, the STI regions 502 are formed by first using a patterning process (including lithography and etching) to etch away unwanted epitaxial material from the bottom source/drain regions 402 (and over-etching into the substrate 200), followed by deposition of a dielectric material and chemical-mechanical polishing (CMP) followed by dielectric recess. Suitable dielectric materials for STI regions 502 include, but are not limited to, oxide materials such as SiOx which can be deposited using a process such as chemical vapor deposition (CVD), atomic layer deposition (ALD) or physical vapor deposition (PVD). The STI regions 502 will serve to isolate the individual VFETs of the device.

Suitable materials for the bottom spacers 504 include, but are not limited to, oxide spacer materials such as SiOx and/or silicon oxycarbide (SiOC) and/or nitride spacer materials such as SiN, silicon-boron-nitride (SiBN), siliconborocarbonitride (SiBCN) and/or silicon oxycarbonitride (SiOCN). According to an exemplary embodiment, the bottom spacers 504 are formed using a directional deposition process whereby a greater amount of the spacer material is deposited on horizontal surfaces (including on top of the bottom source/drain regions 402 and STI regions 502) as compared to vertical surfaces (such as along sidewalls of the fins 102 and fin hardmask 204). Thus, when an etch is used on the spacer material, the timing of the etch needed to remove the spacer material from the vertical surfaces will leave the bottom spacers 504 shown in FIGS. 5A and 5B on the bottom source/drain regions 402 and STI regions 502 since a greater amount of the spacer material was deposited on the bottom source/drain regions 402 and STI regions 502 to begin with. By way of example only, a high-density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces. Bottom spacers 504 offset the bottom source/drain regions 402 from the gate stack (see below). According to an exemplary embodiment, the bottom spacers 504 have a thickness of from about 5 nm to about 20 nm and ranges therebetween.

Figure 5A:
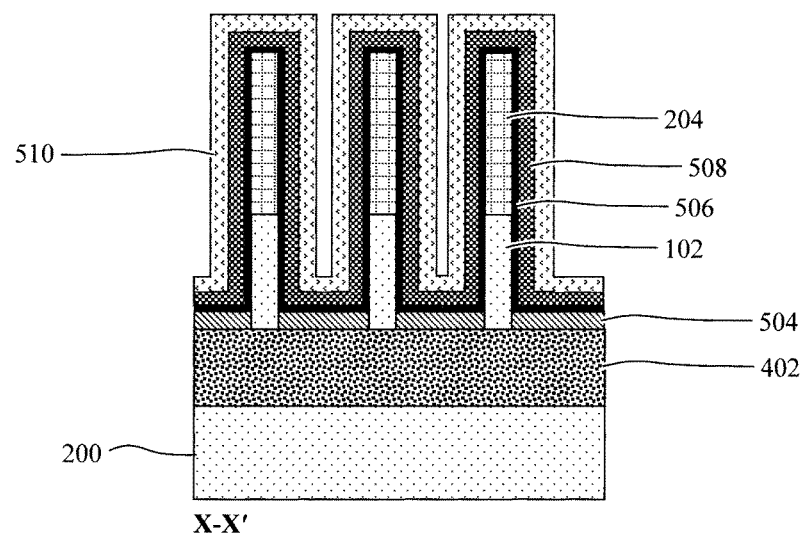
FIG. 5A is an X-X' cross-sectional view illustrating shallow trench isolation (STI) regions having been formed in the bottom source/drain regions and substrate in between the fins, bottom spacers having been formed on the bottom source/drain regions and STI regions, a gate stack (i.e., a gate dielectric and workfunction-setting metal(s)) having been formed over and alongside the fins, fin hardmask and bottom spacers, and a sacrificial layer having been deposited over the workfunction-setting metal(s)
Figure 5B:
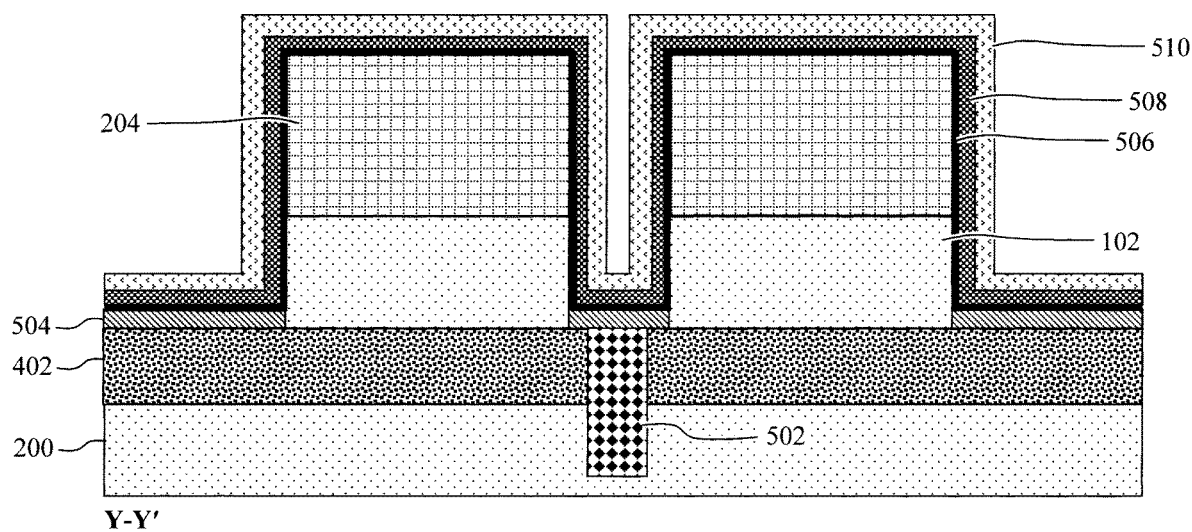
FIG. 5B is a Y-Y' cross-sectional view illustrating the STI regions having been formed in the bottom source/drain regions and substrate in between the fins, the bottom spacers having been formed on the bottom source/drain regions and STI regions, the gate stack having been formed over and alongside the fins, fin hardmask and bottom spacers, and a sacrificial layer having been deposited over the workfunction-setting metal(s) according to an embodiment of the present invention.

A gate stack is then formed over and alongside the fins 102, fin hardmask 204 and bottom spacers 504. As shown in FIGS. 5A and 5B, the gate stack includes a gate dielectric 506 disposed on the top and along the sidewalls of the fins 102 and fin hardmask 204, and on top of the bottom spacers 504, and at least one workfunction-setting metal 508 disposed on the gate dielectric 506. Although not explicitly shown in the figures, an interfacial oxide may be formed on the exposed surfaces of the fins 102 prior to the gate dielectric 506 such that the gate dielectric 506 is disposed on the fins 102 over the interfacial oxide. By way of example only, the interfacial oxide can be formed on the exposed surfaces of the fins 102 by a thermal oxidation, a chemical oxidation, or any other suitable oxide formation process. According to an exemplary embodiment, the interfacial oxide has a thickness of from about 0.5 nanometers (nm) to about 5 nm and ranges therebetween, e.g., about 1 nm.

Suitable materials for the gate dielectric 506 include, but are not limited to, silicon oxide (SiOx), silicon nitride (SiN), silicon oxynitride (SiOxNy), high-κ materials, or any combination thereof. The term "high-κ" as used herein refers to a material having a relative dielectric constant κ which is much higher than that of silicon dioxide (e.g., a dielectric constant κ is about 25 for hafnium oxide ($HfO_2$) rather than 3.9 for $SiO_2$). Suitable high-κ materials include, but are not limited to, metal oxides such as $HfO_2$, hafnium silicon oxide (HfSiO), hafnium silicon oxynitride (HfSiO), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiO), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$) and/or lead zinc niobite (Pb(Zn,Nb)O). The high-κ material can further include dopants such as lanthanum (La), aluminum (Al) and/or magnesium (Mg). The gate dielectric 506 can be deposited using a process or combination of processes such as, but not limited to, thermal oxidation, chemical oxidation, thermal nitridation, plasma oxidation, plasma nitridation, CVD, ALD, etc. According to an exemplary embodiment, the gate dielectric 506 has a thickness of from about 1 nm to about 5 nm and ranges therebetween.

Suitable workfunction-setting metals 508 include, but are not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), titanium carbide (TiC) titanium aluminum carbide (TiAlC), tantalum carbide (TaC) and/or hafnium carbide (HfC). The workfunction-setting metal(s) 508 can be deposited using a process or combination of processes such as, but not limited to, CVD, ALD, PVD, sputtering, plating, evaporation, ion beam deposition, electron beam deposition, laser assisted deposition, chemical solution deposition, etc. According to an exemplary embodiment, the workfunction-setting metal(s) 508 has a thickness of from about 5 nm to about 10 nm and ranges therebetween.

A sacrificial layer 510 is then deposited over the workfunction-setting metal(s) 508. Suitable materials for the sacrificial layer 510 include, but are not limited to, nitride materials such as SiN and/or silicon carbonitride (SiCN), which can be deposited using a process such as CVD, ALD or PVD. According to an exemplary embodiment, the encapsulation layer 510 has a thickness of from about 1 nm to about 6 nm and ranges therebetween. As will be described in detail below, the placement of the sacrificial layer 510 over the workfunction-setting metal(s) 508 will enable a selective indentation of the workfunction-setting metal(s) 508.

Figure 6A:
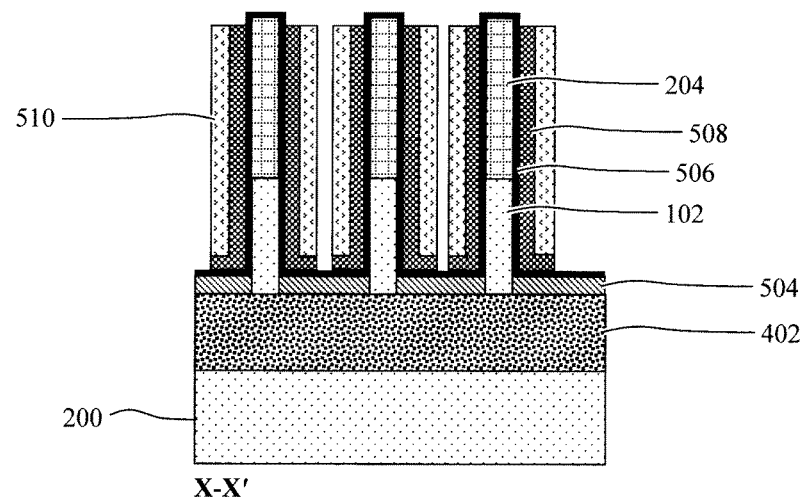
FIG. 6A is an X-X' cross-sectional view illustrating the sacrificial layer and workfunction-setting metal(s) having been recessed.
Figure 6B:
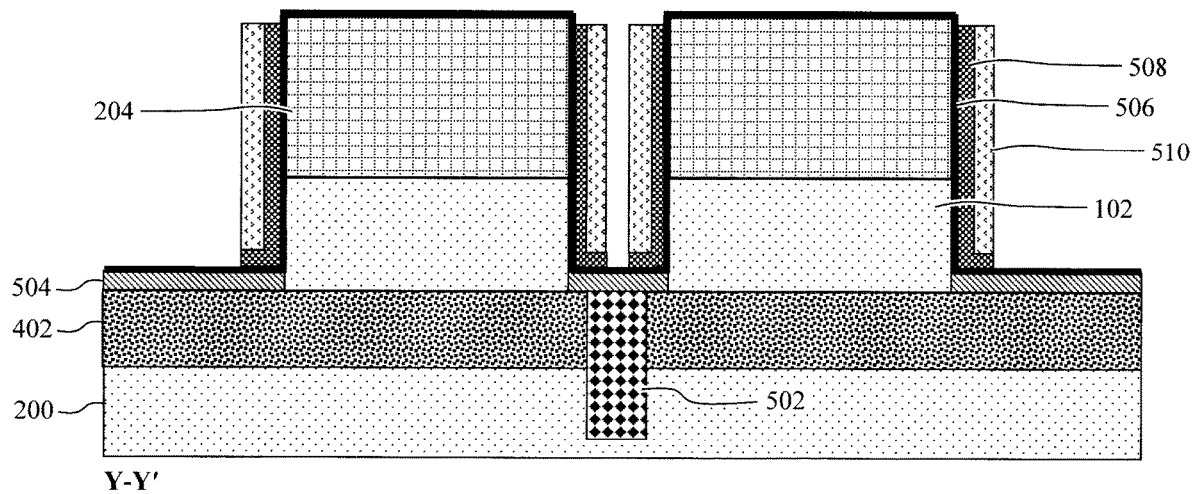
FIG. 6B is a Y-Y' cross-sectional view illustrating the sacrificial layer and workfunction-setting metal(s) having been recessed according to an embodiment of the present invention.

An etch is then performed to recess the sacrificial layer 510 and underlying workfunction-setting metal(s) 508. See FIG. 6A (an X-X' cross-sectional view) and FIG. 6B (a Y-Y' cross-sectional view). A directional (i.e., anisotropic) etching process such as RIE can be employed for the recess etch. According to an exemplary embodiment, the etch chemistry chosen is selective for removal of the sacrificial layer 510 and underlying workfunction-setting metal(s) 508 relative to the gate dielectric 506. As shown in FIGS. 6A and 6B, the sacrificial layer 510 and workfunction-setting metal(s) 508 are now removed from the tops of the fin hardmask 204 and from the horizontal surfaces in between the fins 102.

Notably, this recess etch can be performed without a lithography mask since there is no need to preserve the gate structure in between the fins as is done in conventional process flows. Namely, as will be described in detail below, a gate extension metal will be placed in between the fins 102 and patterned late in the fabrication process. Accordingly, the issues associated with pattern collapse that occurs in conventional process flows (see above) are avoided altogether.

Figure 7A:
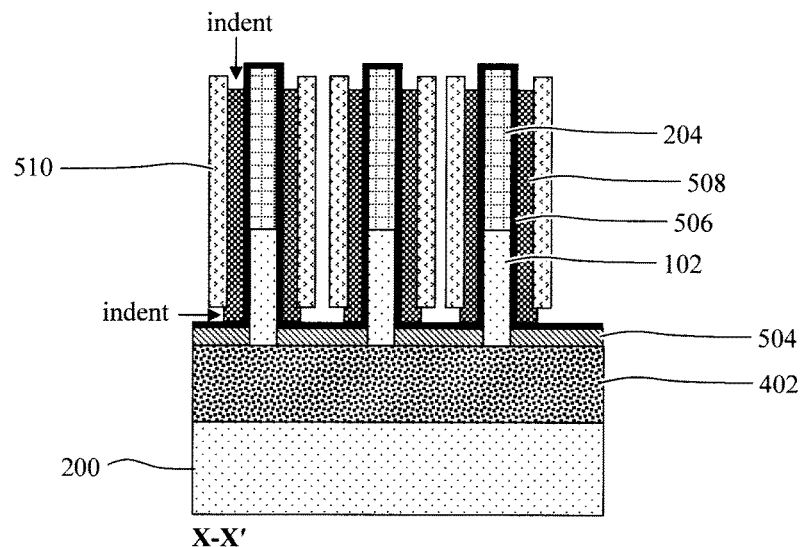
FIG. 7A is an X-X' cross-sectional view illustrating an etch having been performed to indent the ends of the workfunction-setting metal(s)
Figure 7B:
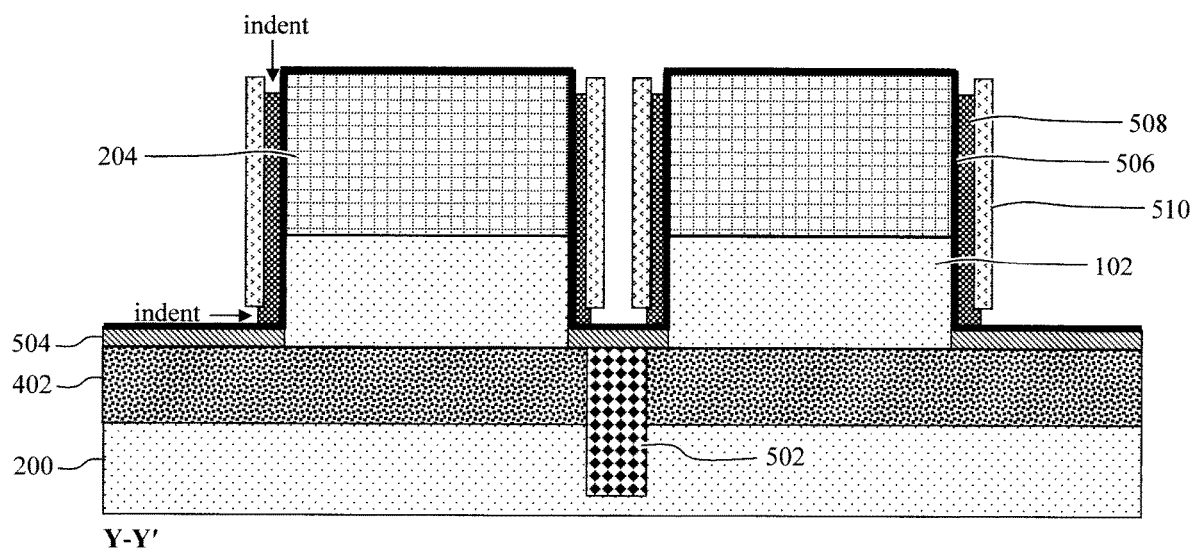
FIG. 7B is a Y-Y' cross-sectional view illustrating the etch having been performed to indent the ends of the workfunction-setting metal(s) according to an embodiment of the present invention.
Figure 8A:
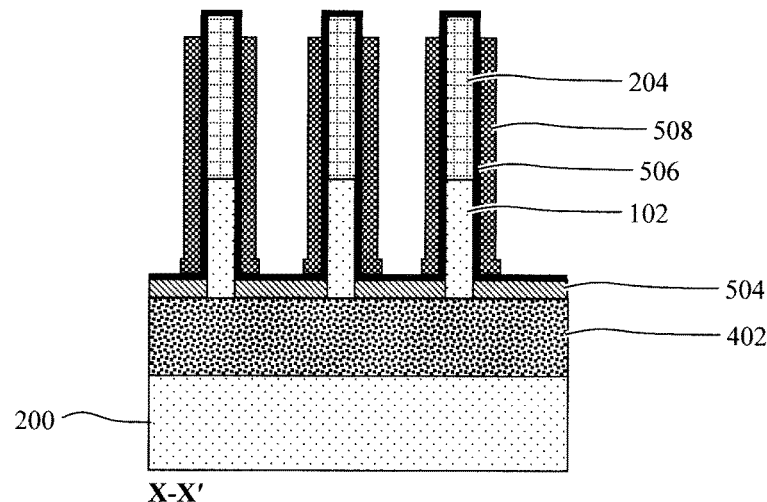
FIG. 8A is an X-X' cross-sectional view illustrating the sacrificial layer having been selectively removed.
Figure 8B:
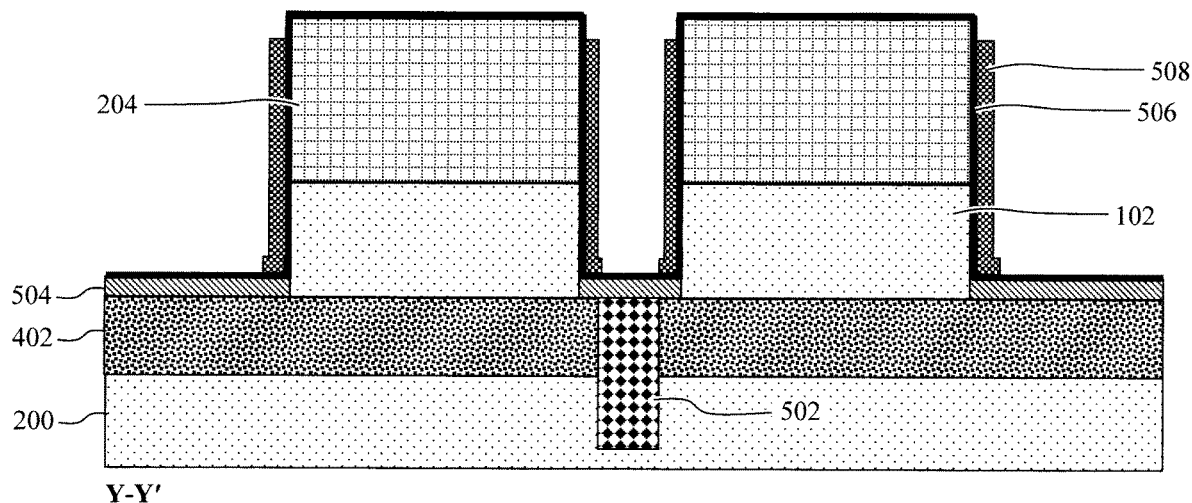
FIG. 8B is a Y-Y' cross-sectional view illustrating the sacrificial layer having been selectively removed according to an embodiment of the present invention.

An etch is then performed to indent the ends of the workfunction-setting metal(s) 508. See FIG. 7A (an X-X' cross-sectional view) and FIG. 7B (a Y-Y' cross-sectional view). Namely, as shown in FIGS. 7A and 7B, the (indented) ends of the workfunction-setting metal(s) 508 are now set in from the ends of the sacrificial layer 510. A selective non-directional (i.e., isotropic) etching process such as a wet chemical etch or gas phase etch can be employed to indent the workfunction-setting metal(s) 508. With the sacrificial layer 510 present over and protecting the bulk of the workfunction-setting metal(s) 508, this indentation etch will affect only the few exposed portions of the workfunction-setting metal(s) 508 at the top of the fin hardmask 204 and at the base of the fins 102. The workfunction-setting metal(s) 508 is indented to avoid the risk of a short between the gate stacks and the bottom source/drain contacts to be formed later in the process.

What remains of the sacrificial layer 510 is then selectively removed. See FIG. 8A (an X-X' cross-sectional view) and FIG. 8B (a Y-Y' cross-sectional view). As provided above, the sacrificial layer 510 can be formed from a nitride material such as SiN and/or SiCN. In that case, a nitride-selective etch such as a nitride-selective wet chemical etch can be employed to remove the sacrificial layer 510.

Figure 9A:
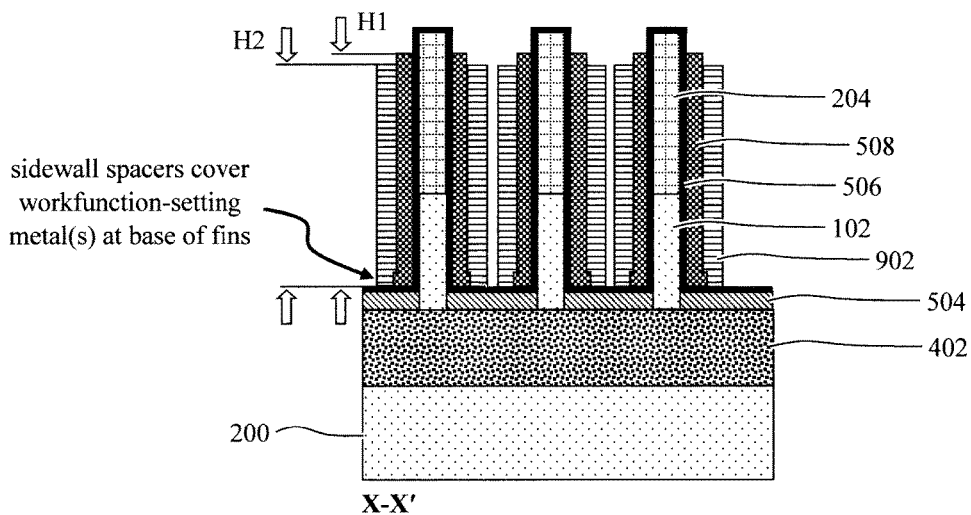
FIG. 9A is an X-X' cross-sectional view illustrating sidewall spacers having been formed along the sidewalls of the fins and fin hardmask, over the gate stack.
Figure 9B:
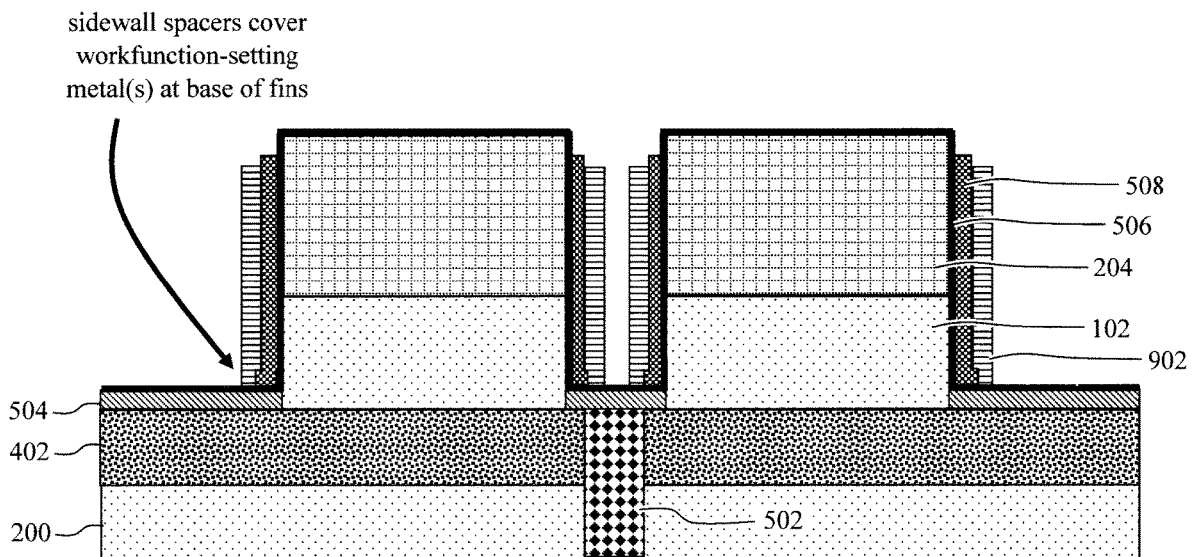
FIG. 9B is a Y-Y' cross-sectional view illustrating the sidewall spacers having been formed along the sidewalls of the fins and fin hardmask, over the gate stack according to an embodiment of the present invention.

Sidewall spacers 902 are then formed along the sidewalls of the fins 102 and fin hardmask 204, over the gate stack (i.e., gate dielectric 506 and workfunction-setting metal(s) 508). See FIG. 9A (an X-X' cross-sectional view) and FIG. 9B (a Y-Y' cross-sectional view). Suitable materials for the sidewall spacers 902 include, but are not limited to, SiN and/or silicon oxynitride (SiON) which can be deposited over the fins 102 and fin hardmask 204 using a process such as CVD, ALD or PVD. A directional (i.e., anisotropic) etching process such as RIE can then be employed to pattern the sidewall spacer material into the individual sidewall spacers 902 depicted in FIGS. 9A and 9B. As shown in FIGS. 9A and 9B, by way of the above-described process a height H1 of the workfunction-setting metal(s) 508 can end up being greater than a height H2 of the sidewall spacers 902, i.e., H1>H2. However, what is important is that the sidewall spacers 902 cover over the (indented) ends of the workfunction-setting metal(s) 508 at the base of the fins 102. As highlighted above, this is to avoid the risk of a short between the gate stacks and the bottom source/drain contacts to be formed later in the process.

Figure 10A:
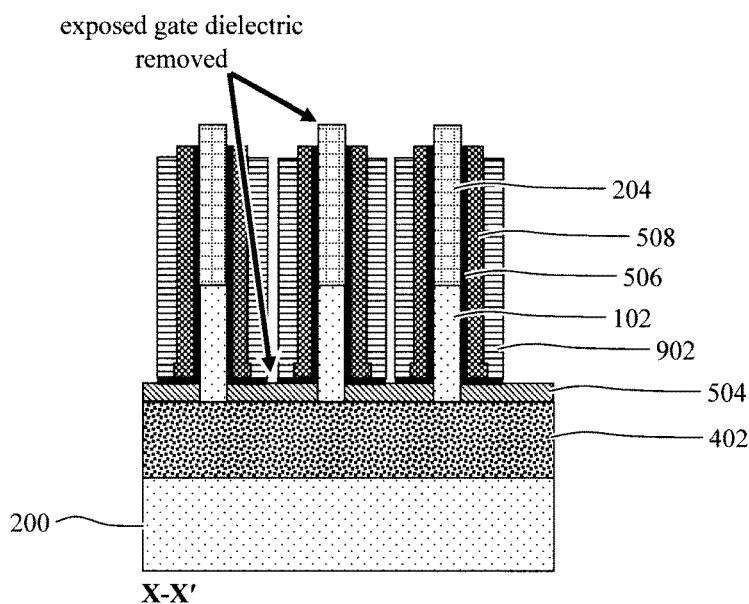
FIG. 10A is an X-X' cross-sectional view illustrating exposed portions of the gate dielectric having been selectively removed.
Figure 10B:
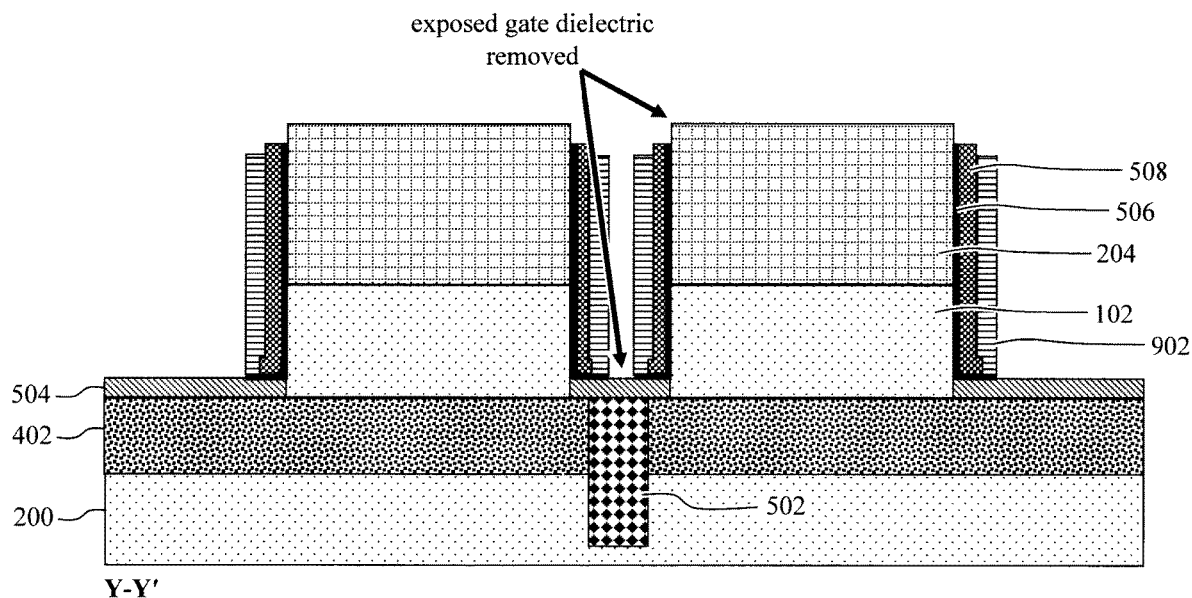
FIG. 10B is a Y-Y' cross-sectional view illustrating the exposed portions of the gate dielectric having been selectively removed according to an embodiment of the present invention.
Figure 11A:
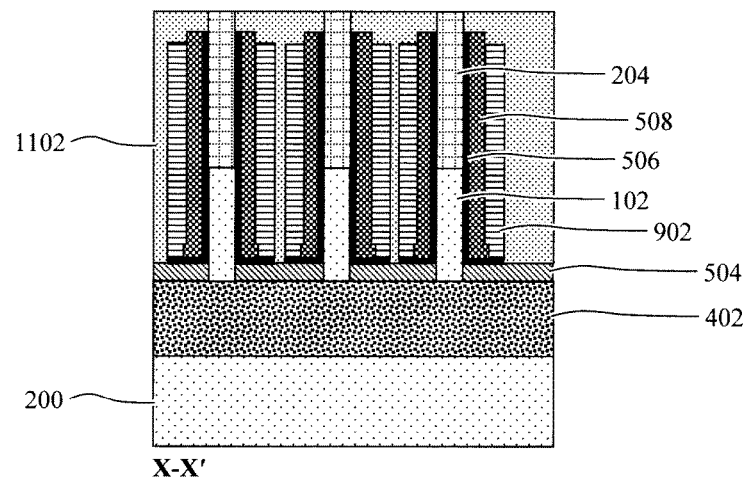
FIG. 11A is an X-X' cross-sectional view illustrating a (first) interlayer dielectric (ILD) having been deposited over the fins/fin hardmask, gate stacks and sidewall spacers.
Figure 11B:
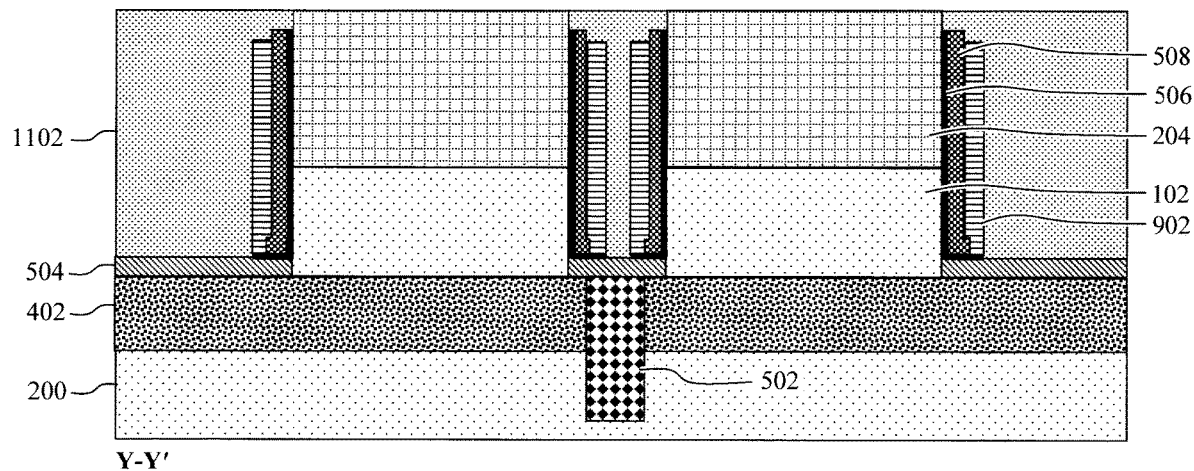
FIG. 11B is a Y-Y' cross-sectional view illustrating the first ILD having been deposited over the fins/fin hardmask, gate stacks and sidewall spacers according to an embodiment of the present invention.
Figure 12A:
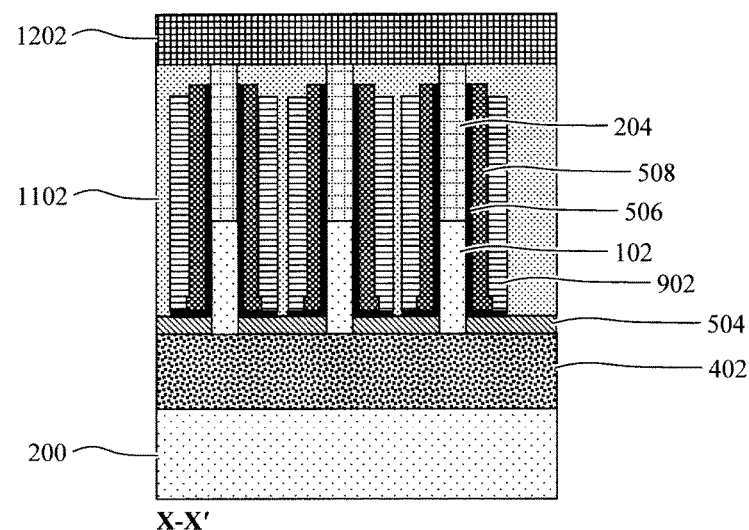
FIG. 12A is an X-X' cross-sectional view illustrating a sacrificial mask having been formed on the first ILD marking the footprint and location of at least one gate extension region.
Figure 12B:
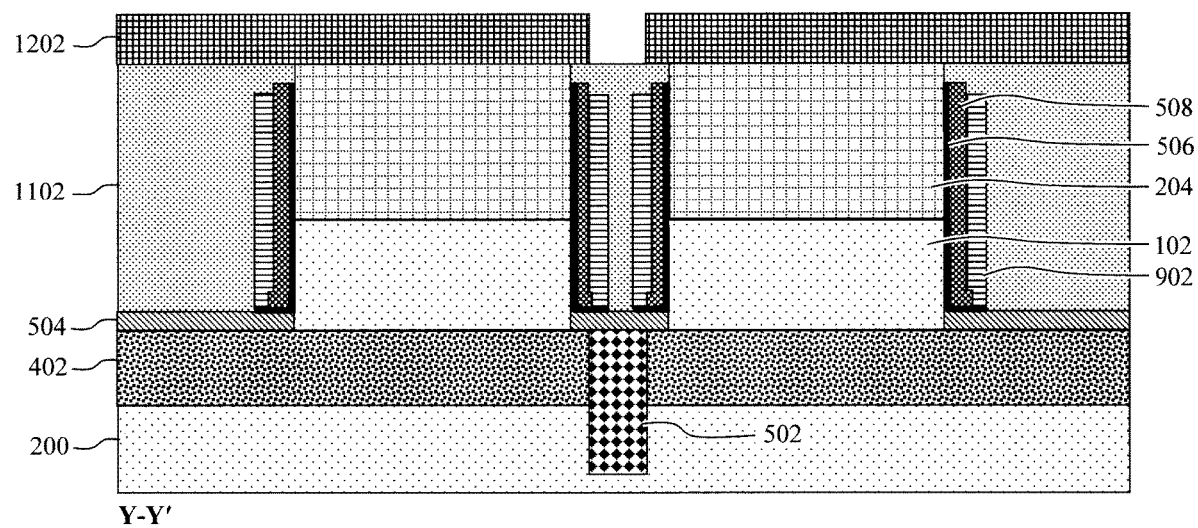
FIG. 12B is a Y-Y' cross-sectional view illustrating the sacrificial mask having been formed on the first ILD marking the at least one gate extension region according to an embodiment of the present invention.
Figure 13:
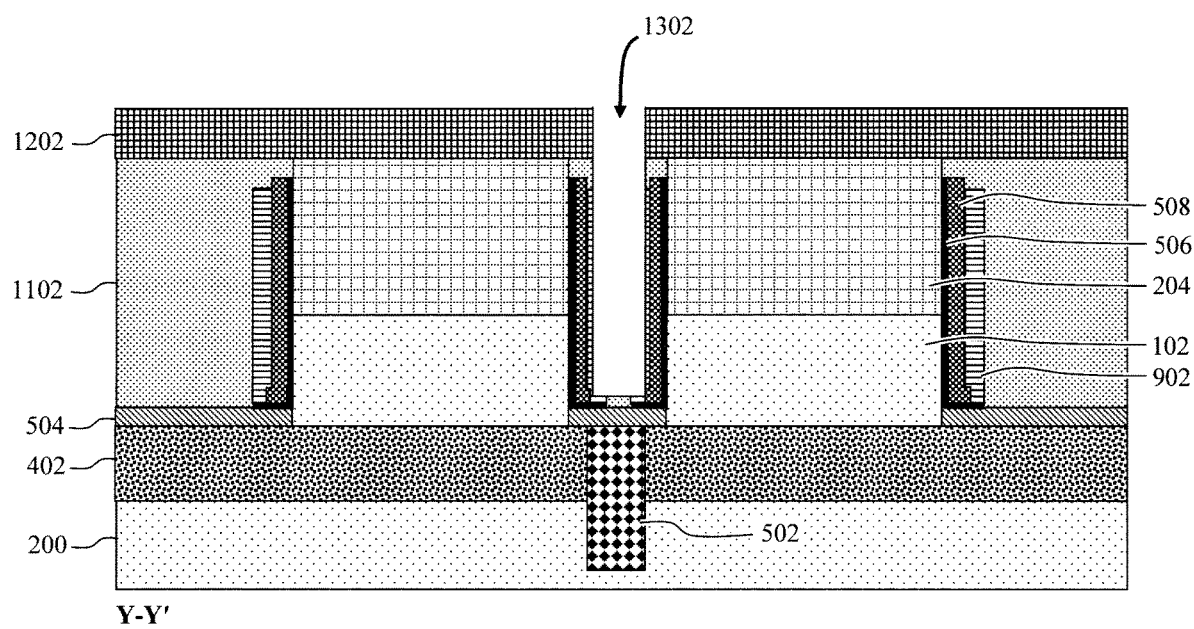
FIG. 13 is a Y-Y' cross-sectional view illustrating an etch using the sacrificial mask having been performed to at least partially remove the sidewall spacers and first ILD in between adjacent fins forming a trench in between the adjacent fins according to an embodiment of the present invention.

The exposed portions of the gate dielectric 506 (i.e., those portions of the gate dielectric 506 not covered by the workfunction-setting metal(s) 508 and/or the sidewall spacers 902) are selectively removed. See FIG. 10A (an X-X' cross-sectional view) and FIG. 10B (a Y-Y' cross-sectional view). As shown in FIGS. 10A and 10B, this includes removal of the exposed portions of the gate dielectric 506 at the top of the fin hardmask 204, and along the bottom spacers 504 in between the fins 102. A selective, non-directional (i.e., isotropic) etching process such as a wet chemical etch or gas phase etch can be employed to remove the exposed portions of the gate dielectric 506.

An interlayer dielectric (ILD) 1102 is then deposited over the fins 102/fin hardmask 204, gate stacks (i.e., gate dielectric 506 and workfunction-setting metal(s) 508) and sidewall spacers 902. See FIG. 11A (an X-X' cross-sectional view) and FIG. 11B (a Y-Y' cross-sectional view). Suitable ILD 1102 materials include, but are not limited to, oxide materials such as SiOx and/or organosilicate glass (SiCOH) and/or ultralow-κ interlayer dielectric (ULK-ILD) materials, e.g., having a dielectric constant κ of less than 2.7. Suitable ultralow-κ dielectric materials include, but are not limited to, porous organosilicate glass (pSiCOH). A process such as CVD, ALD, or PVD can be used to deposit the ILD 1102. Following deposition, the ILD 1102 can be polished down to the fin hardmask 204 using a process such as CMP.

The next task is to perform a late gate extension patterning followed by the placement of a gate extension metal in between the fins 102. To do so, a sacrificial mask 1202 is first formed on the ILD 1102 marking the footprint and location of at least one gate extension region. See FIG. 12A (an X-X' cross-sectional view) and FIG. 12B (a Y-Y' cross-sectional view). Suitable materials for the sacrificial mask 1202 include, but are not limited to, poly-silicon (poly-Si) and/or amorphous silicon (a-Si), which can be deposited onto the ILD 1102 using a process such as CVD, ALD, or PVD. Standard lithography and etching techniques (see above) can then be employed to pattern the sacrificial mask material into the sacrificial mask 1202 shown in FIGS. 12A and 12B.

An etch using the sacrificial mask 1202 is then performed to at least partially remove the sidewall spacers 902 and ILD 1102 in between the adjacent fins 102, forming a trench 1302 in between the adjacent fins 102. See FIG. 13 (a Y-Y' cross-sectional view). According to the exemplary embodiment shown in FIG. 13, a bulk of the sidewall spacers 902 and ILD 1102 in between the adjacent fins 102 is removed in this step. Namely, a small portion of the sidewall spacers 902 and ILD 1102 remains alongside the workfunction-setting metal(s) 508 and at the bottom of the trench 1302. It is not necessary to reach the bottom of the trench 1302, as the residual will be removed in the next etch step. According to an exemplary embodiment, trench 1302 is formed in between the adjacent fins 102 using a non-selective nitride/oxide etch to at least partially remove the sidewall spacers 902/ILD 1102, respectively.

Figure 14:
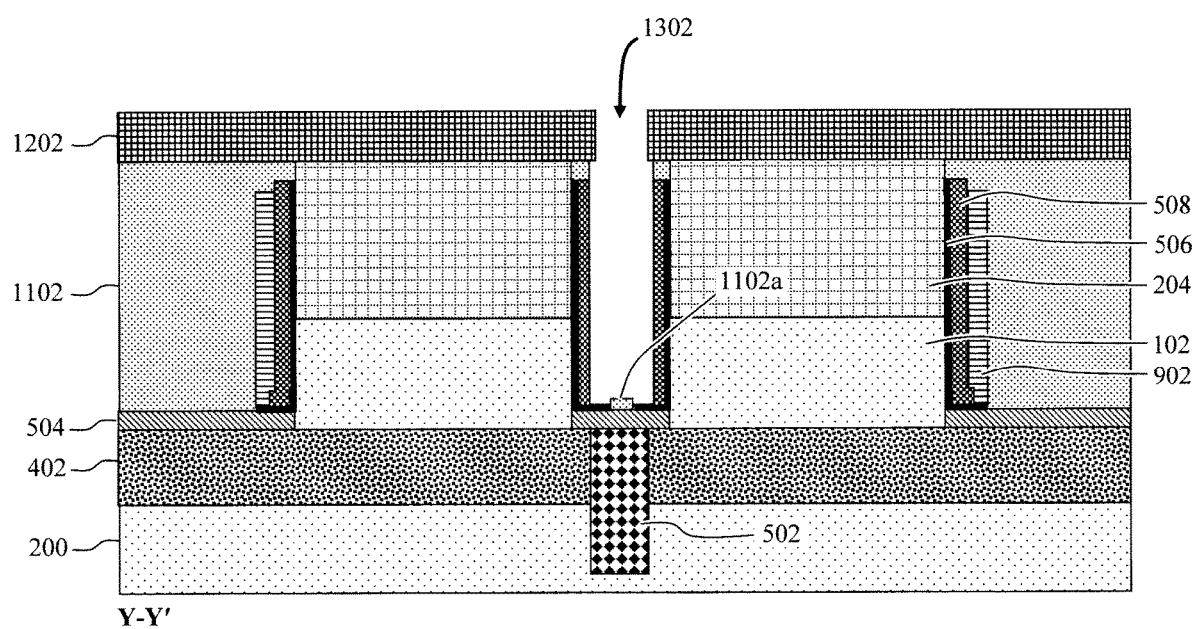
FIG. 14 is a Y-Y' cross-sectional view illustrating a follow-up etch having been performed to remove any residual of the sidewall spacers that remains in the trench in between the adjacent fins according to an embodiment of the present invention.

A follow-up etch is then performed to remove any of the residual sidewall spacers 902 that remain in the trench 1302 in between the adjacent fins 102. See FIG. 14 (a Y-Y' cross-sectional view). A selective, non-directional (i.e., isotropic) etching process such as a nitride-selective wet chemical etch or gas phase etch can be employed to remove the residual sidewall spacers 902 from the trench 1302. As shown in FIG. 14, the gate dielectric 506 is now exposed at the bottom of the trench 1302. As also shown in FIG. 14, a small remaining portion 1102a of the ILD 1102 can also be present at the bottom of the trench 1302.

Figure 15A:
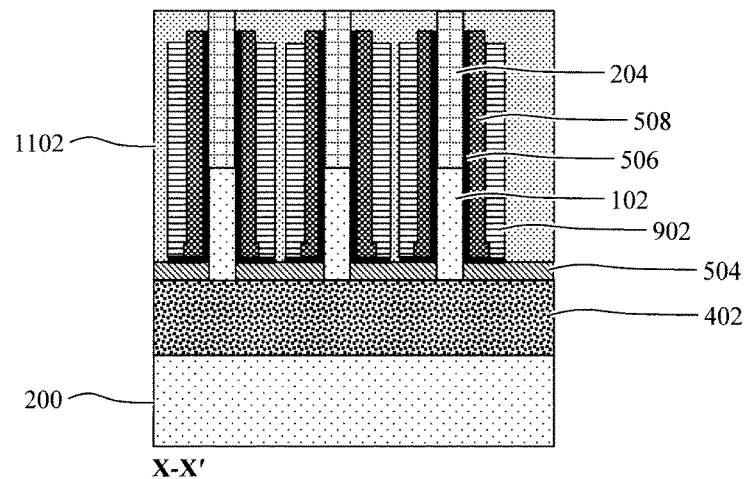
FIG. 15A is an X-X' cross-sectional view illustrating the sacrificial mask having been removed.
Figure 15B:
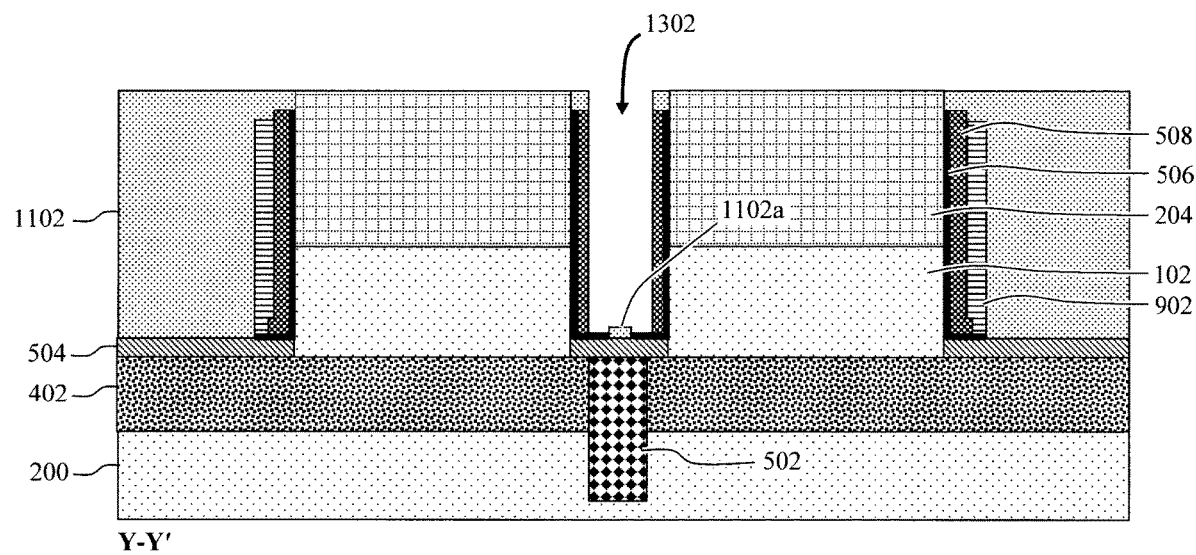
FIG. 15B is a Y-Y' cross-sectional view illustrating the sacrificial mask having been removed according to an embodiment of the present invention.
Figure 16A:
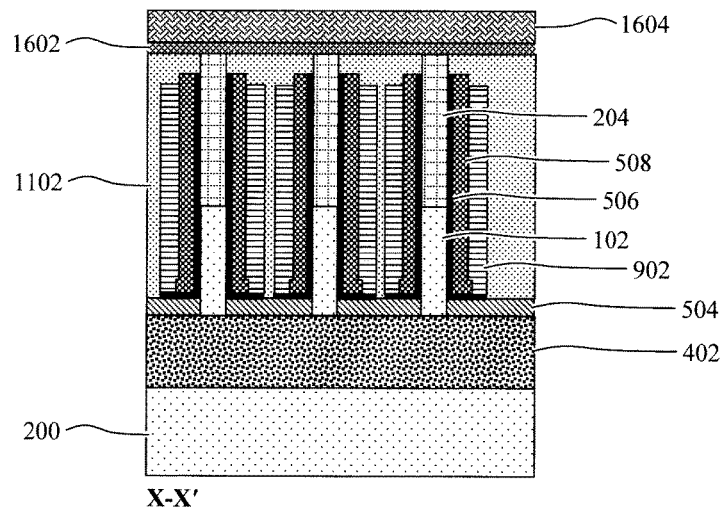
FIG. 16A is an X-X' cross-sectional view illustrating a conformal barrier layer having been formed on the first ILD/fin hardmask and on the workfunction-setting metal(s) exposed along the sidewalls of the trench in between the adjacent fins, and a gate extension metal(s) having been deposited onto the barrier layer and filling the trench.
Figure 16B:
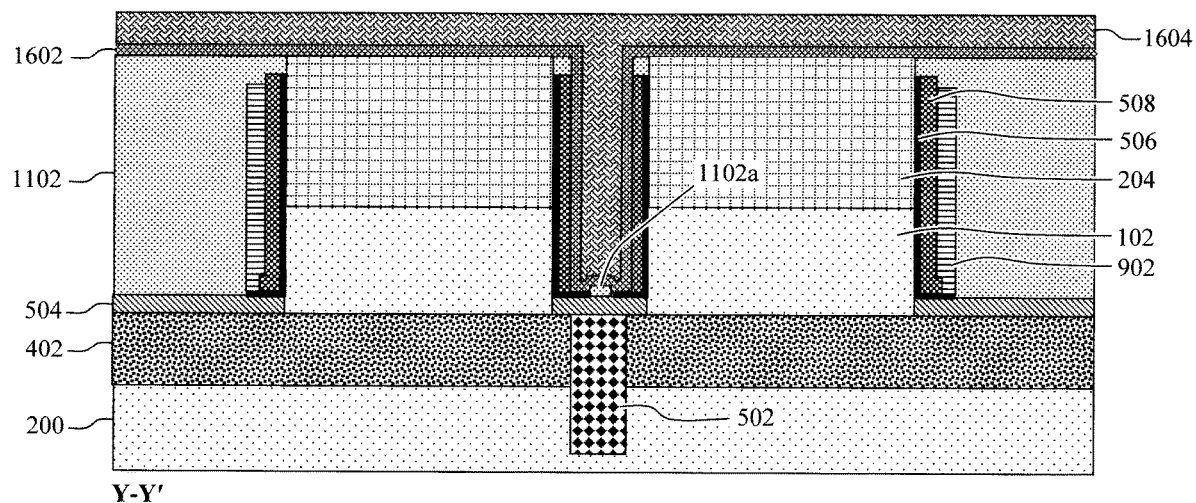
FIG. 16B is a Y-Y' cross-sectional view illustrating the conformal barrier layer having been formed on the first ILD/fin hardmask and on the workfunction-setting metal(s) exposed along the sidewalls of the trench in between the adjacent fins, and a gate extension metal(s) having been deposited onto the barrier layer and filling the trench according to an embodiment of the present invention.

The sacrificial mask 1202 is then removed. See FIG. 15A (an X-X' cross-sectional view) and FIG. 15B (a Y-Y' cross-sectional view). By way of example only, the sacrificial mask 1202 can be removed using a selective etching process. As shown in FIGS. 15A and 15B, the workfunction-setting metal(s) 508 are now exposed along the sidewalls of the trench 1302. However, a protective barrier layer will be formed over these exposed sidewalls of the workfunction-setting metal(s) 508. That way, the workfunction-setting metal(s) 508 will be protected from damage during subsequent processing steps, such as during the formation (deposition and recess etch) of the gate extension metal in the trench 1302.

Namely, a conformal barrier layer 1602 is next formed on the ILD 1102/fin hardmask 204 and on the workfunction-setting metal(s) 508 exposed along the sidewalls of the trench 1302 in between the adjacent fins 102. See FIG. 16A (an X-X' cross-sectional view) and FIG. 16B (a Y-Y' cross-sectional view). Suitable materials for the barrier layer 1602 include, but are not limited to, titanium (Ti), tantalum (Ta), titanium nitride (TiN) and/or tantalum nitride (TaN), which can be deposited using a process such as CVD, ALD or PVD. According to an exemplary embodiment, the conformal barrier layer 1602 is formed having a thickness of from about 1 nm to about 5 nm and ranges therebetween.

A gate extension metal (or combination of metals) 1604 is then deposited onto the barrier layer 1602 and filling the trench 1302. Suitable gate extension metals include, but are not limited to, tungsten (W) and/or aluminum (Al), which can be deposited using a process or combination of processes such as, but not limited to, CVD, ALD, PVD, sputtering, plating, evaporation, ion beam deposition, electron beam deposition, laser assisted deposition, chemical solution deposition, etc. One or more of the same workfunction-setting metal(s) 508 can be used as the gate extension metal(s) 1604. However, since the gate extension metal(s) 1604 are being deposited independently of the workfunction-setting metal(s) 508, embodiments are contemplated herein where a different metal(s) is/are employed as the gate extension metal(s) 1604 than those metal(s) being employed as the workfunction-setting metal(s) 508. Following deposition, the gate extension metal(s) 1604 can be polished using a process such as CMP. Notably, the barrier layer 1602 covers/protects the workfunction-setting metal(s) 508 beneath the gate extension metal(s) 1604.

Figure 17A:
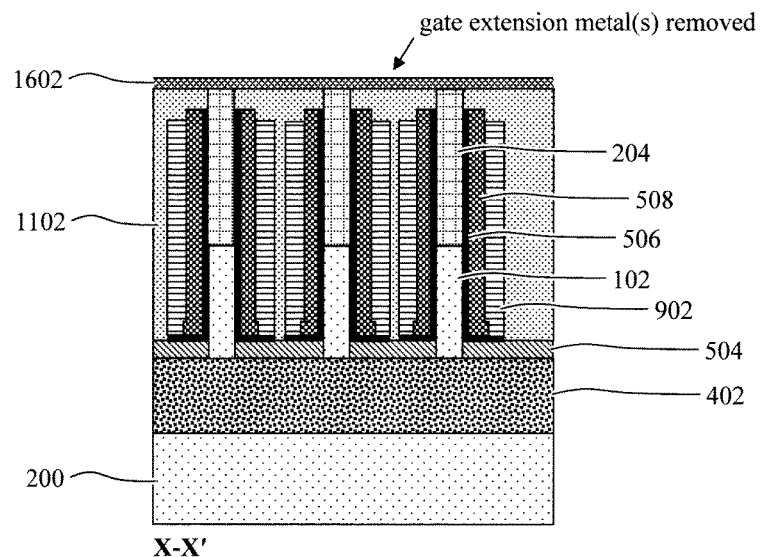
FIG. 17A is an X-X' cross-sectional view illustrating an etch having been performed to selectively recess the gate extension metal(s)
Figure 17B:
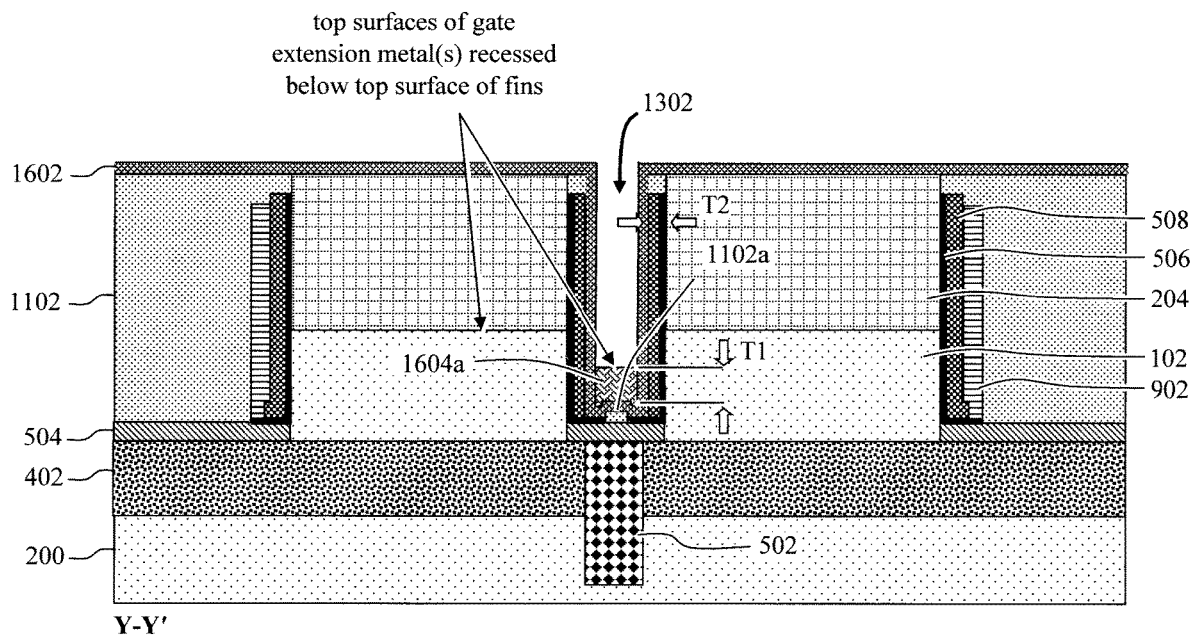
FIG. 17B is a Y-Y' cross-sectional view illustrating the etch having been performed to selectively recess the gate extension metal(s) according to an embodiment of the present invention.

An etch is then performed to selectively recess the gate extension metal(s) 1604. See FIG. 17A (an X-X' cross-sectional view) and FIG. 17B (a Y-Y' cross-sectional view). Namely, as shown in FIGS. 17A and 17B, the gate extension metal(s) 1604 is recessed selective to the barrier layer 1602. By way of example only, as provided above, the barrier layer 1602 can be formed from a material such as TiN, and the gate extension metal(s) 1604 can be tungsten (W). In that case, a gas phase etch in sulfur hexafluoride ($SF_6$)/nitrogen trifluoride ($NF_3$), helium (He) and chlorine ($Cl_2$) can be employed to selectively etch/recess the gate extension metal(s) 1604 (W) relative to the barrier layer 1602 (TiN). See, for example, U.S. Pat. No. 7,972,966 issued to Breitwisch et al., entitled "Etching of Tungsten Selective to Titanium Nitride." By way of the recess etch, the gate extension metal(s) 1604 are removed from the top surface of the barrier layer 1602 (see, e.g., FIG. 17A). In one exemplary embodiment, the gate extension metal(s) 1604 is recessed below the tops of the fins 102, i.e., a top surface of the recessed gate extension metal(s) 1604, as recessed, is below a top surface of the fins 102 (see, e.g., FIG. 17B). The recessed gate extension metal(s) is now given the reference numeral 1604a. As shown, for example, in FIG. 17B, the gate extension metal(s) 1604a is now present adjacent to the gate stacks (i.e., gate dielectric 506 and workfunction-setting metal(s) 508) at the base of the fins 102. The barrier layer 1602 separates the gate extension metal(s) 1604a from the gate stacks.

Further, by way of the present process, the gate extension metal(s) 1604a provides a robust gate extension structure between the fins 102 (i.e., the vertical fin channels). For instance, according to an exemplary embodiment, the recessed gate extension metal(s) 1604a has a thickness T1 and the gate stack (i.e., gate dielectric 506 and workfunction-setting metal(s) 508) has a thickness T2, where T1 is greater than T2, i.e., T1>T2.

As provided above, barrier layer 1602 serves to protect the workfunction-setting metal(s) 508 during this recess etch of the gate extension metal(s). Namely, as shown in FIGS. 17A and 17B, barrier layer 1602 is disposed over (and fully covers/protects) the workfunction-setting metal(s) 508 along the sidewalls of the trench 1302. Thus, any damage to the workfunction-setting metal(s) 508 is avoided.

Figure 18A:
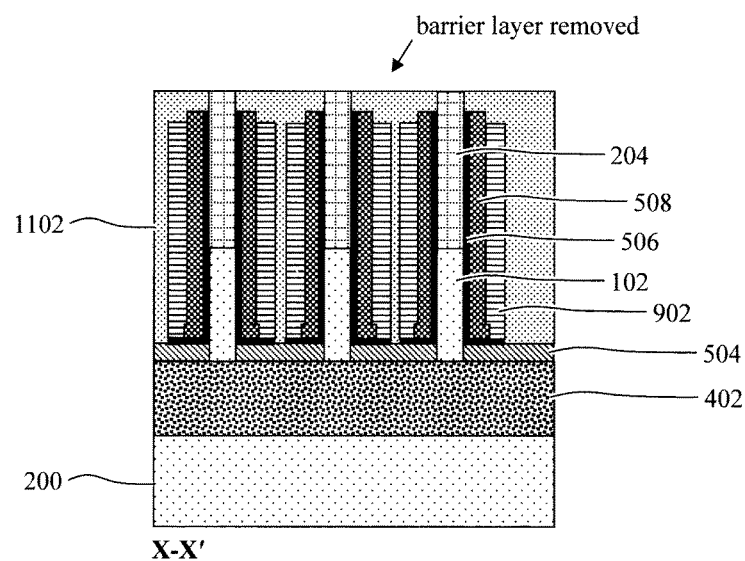
FIG. 18A is an X-X' cross-sectional view illustrating an etch-back of the barrier layer having been performed.
Figure 18B:
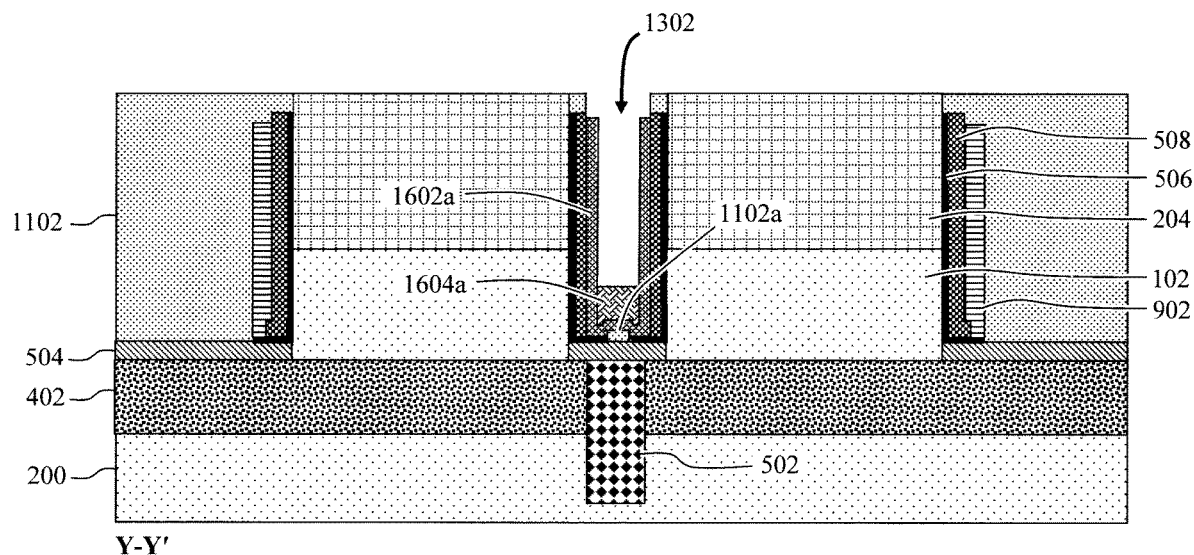
FIG. 18B is a Y-Y' cross-sectional view illustrating the etch-back of the barrier layer having been performed according to an embodiment of the present invention.
Figure 19:
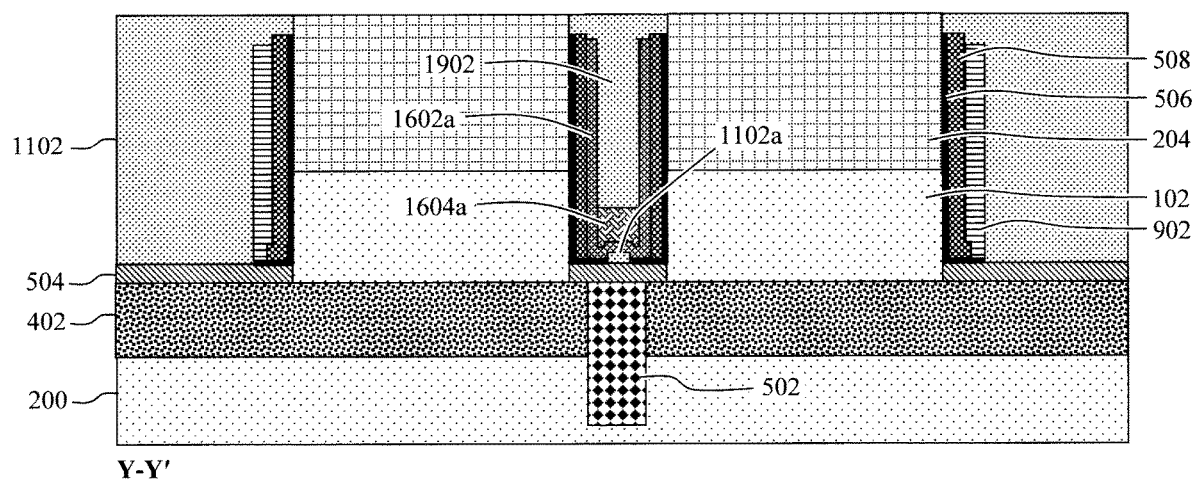
FIG. 19 is a Y-Y' cross-sectional view illustrating a (second) ILD having been deposited into the trench according to an embodiment of the present invention.
Figure 20A:
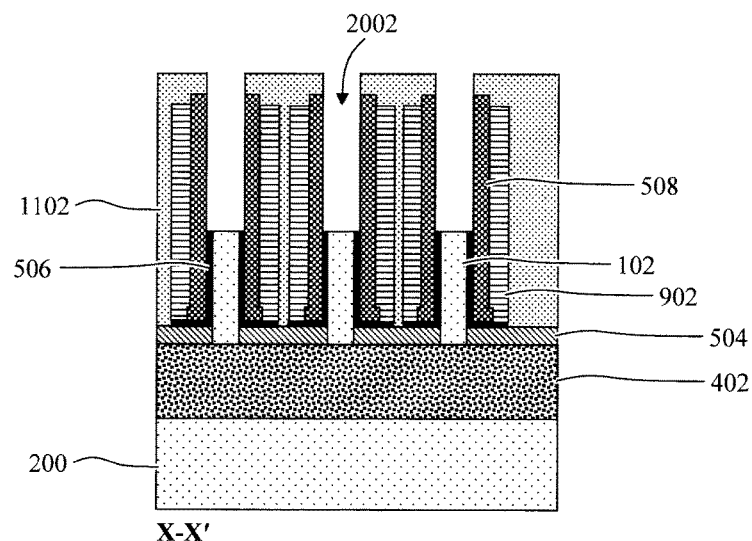
FIG. 20A is an X-X' cross-sectional view illustrating the fin hardmask and exposed gate dielectric having been removed forming trenches in the first/second ILD over the fins.
Figure 20B:
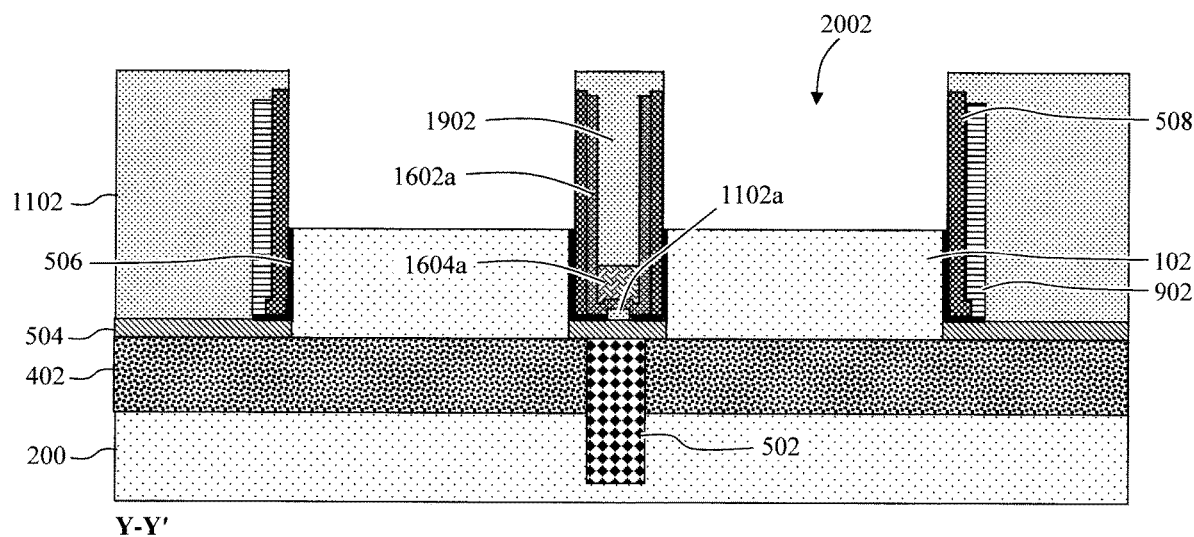
FIG. 20B is a Y-Y' cross-sectional view illustrating the fin hardmask and exposed gate dielectric having been removed forming the trenches in the first/second ILD according to an embodiment of the present invention.

An etch-back of the barrier layer 1602 is then performed, removing the barrier layer 1602 from horizontal surfaces including the top surfaces of the fin hardmask 204 and ILD 1102. See FIG. 18A (an X-X' cross-sectional view) and FIG. 18B (a Y-Y' cross-sectional view). A directional (i.e., anisotropic) etching process such as RIE can be employed for the etch-back of barrier layer 1602. As shown in FIG. 18B, following the etch-back of barrier layer 1602, portions of the barrier layer (now given the reference numeral 1602a) remain only along the sidewalls of the trench 1302 over the workfunction-setting metal(s) 508, and at the bottom of the trench 1302 beneath the recessed gate extension metal(s) 1604a.

An ILD 1902 is then deposited into and filling the trench 1302 over the barrier layer 1602a, the workfunction-setting metal(s) 508 and the (recessed) gate extension metal(s) 1604a. See FIG. 19 (a Y-Y' cross-sectional view). For clarity, the terms 'first' and 'second' may also be used herein when referring to ILD 1102 and ILD 1902, respectively. Suitable ILD 1902 materials include, but are not limited to, oxide materials such as SiOx and/or SiCOH and/or ULK-ILD materials such as pSiCOH. A process such as CVD, ALD, or PVD can be used to deposit the ILD 1902. Following deposition, the ILD 1902 can be polished using a process such as CMP.

The fin hardmask 204 is then selectively removed exposing the gate dielectric 506 above the fins 102, which is then also selectively removed. See FIG. 20A (an X-X' cross-sectional view) and FIG. 20B (a Y-Y' cross-sectional view). Depending on the material chosen for the fin hardmask 204 (see above), a nitride- or oxide-selective etch can be employed to selectively remove the fin hardmask 204. An etch in dilute hydrofluoric (HF) acid can be employed to selectively remove the gate dielectric 506 exposed above the fins 102. Removal of the fin hardmask 204 and gate dielectric 506 forms trenches 2002 in the ILD 1102/1902 over the fins 102.

Figure 21A:
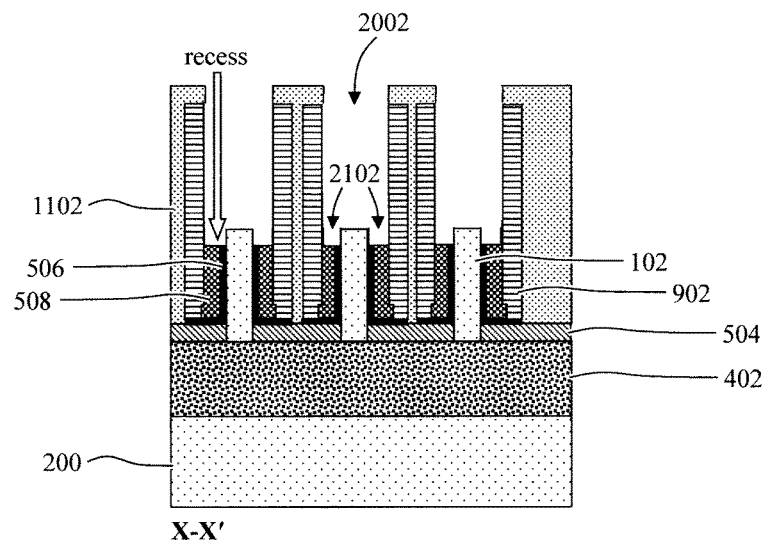
FIG. 21A is an X-X' cross-sectional view illustrating an etch having been performed to recess the gate stack and barrier layer.
Figure 21B:
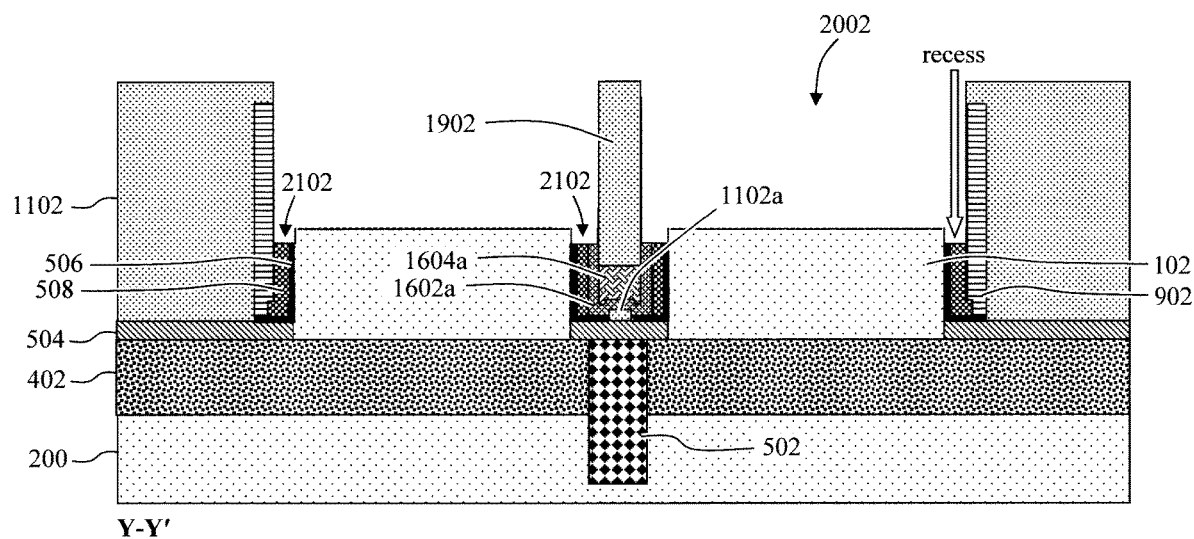
FIG. 21B is a Y-Y' cross-sectional view illustrating the etch having been performed to recess the gate stack and barrier layer according to an embodiment of the present invention.
Figure 22A:
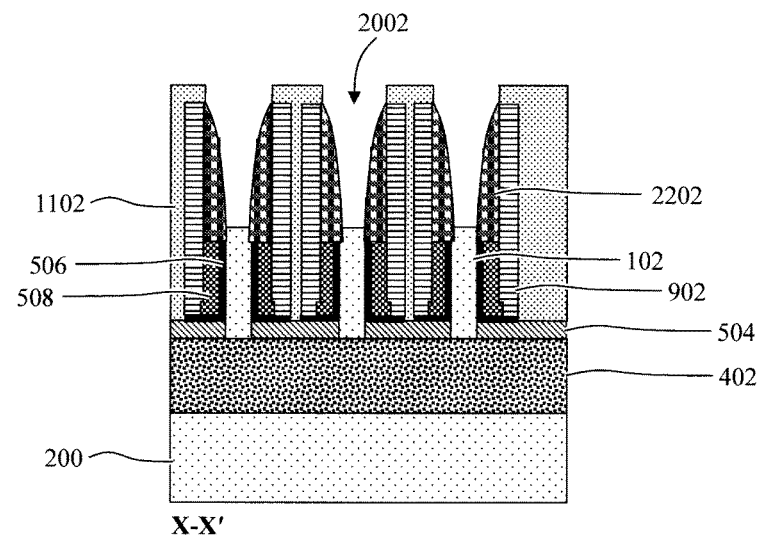
FIG. 22A is an X-X' cross-sectional view illustrating top spacers having been formed along sidewalls of the trenches.
Figure 22B:
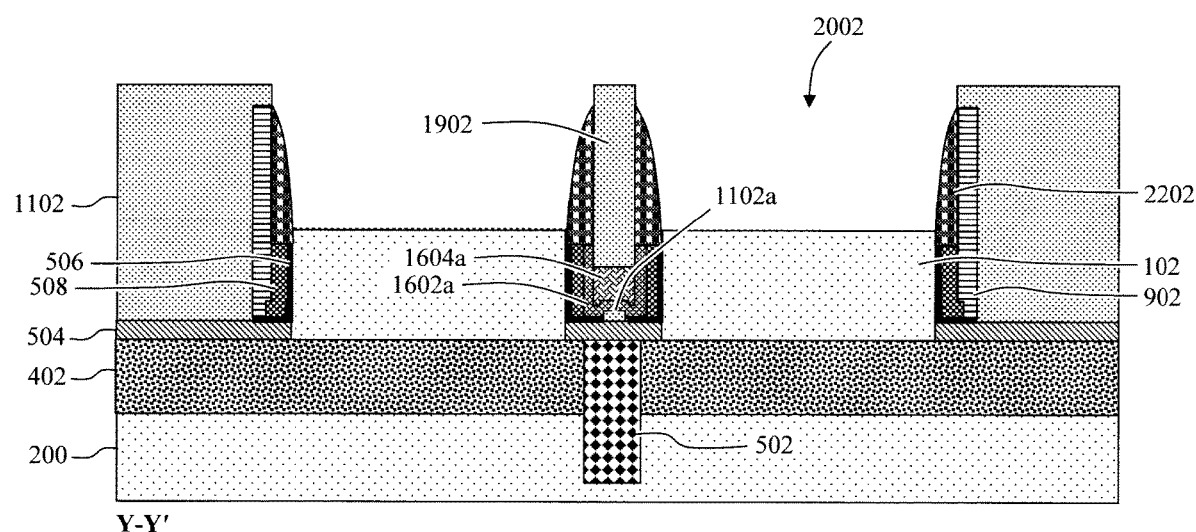
FIG. 22B is a Y-Y' cross-sectional view illustrating the top spacers having been formed along the sidewalls of the trenches according to an embodiment of the present invention.

An etch is then performed to recess the gate stack (i.e., gate dielectric 506 and workfunction-setting metal(s) 508) and barrier layer 1602a. See FIG. 21A (an X-X' cross-sectional view) and FIG. 21B (a Y-Y' cross-sectional view). A non-directional (i.e., isotropic) etching process such as a wet chemical or gas phase etch can be employed for the recess etch. As shown in FIGS. 21A and 21B, according to an exemplary embodiment, the recessed gate stack is below the top surface of the fins 102 which creates divots 2102 alongside opposite sides of the fins 102.

Top spacers 2202 are then formed along sidewalls of the trenches 2002, filling the divots 2102. See FIG. 22A (an X-X' cross-sectional view) and FIG. 22B (a Y-Y' cross-sectional view). Suitable materials for top spacers 2202 include, but are not limited to, oxide spacer materials such as SiOx and/or SiOC and/or nitride spacer materials such as SiN, SiBN, SiBCN and/or SiOCN, which can be deposited using a process such as CVD, ALD or PVD. A directional (i.e., anisotropic) etching process such as RIE can then be employed to pattern the spacer material into the individual top spacers 2202 shown in FIG. 22. Top spacers 2202 will offset the gate stack from the top source/drain regions 2302 that will be formed at the tops of the fins 102.

Figure 23A:
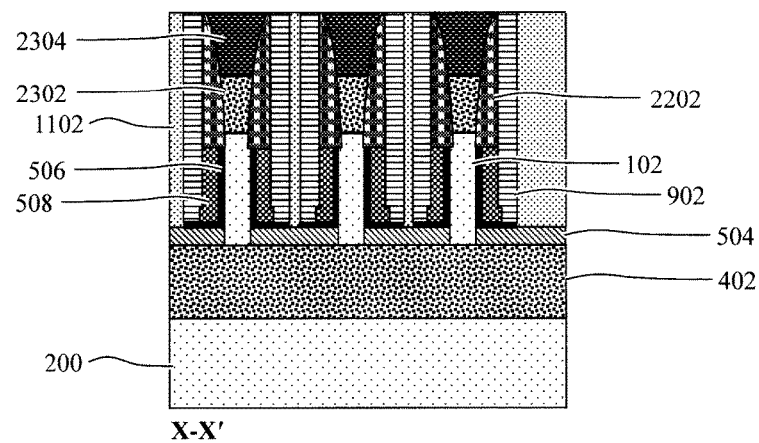
FIG. 23A is an X-X' cross-sectional view illustrating top source/drain regions having been formed in the trenches at the tops of the fins in between the top spacers, and dielectric caps having been formed on the top source/drain regions.
Figure 23B:
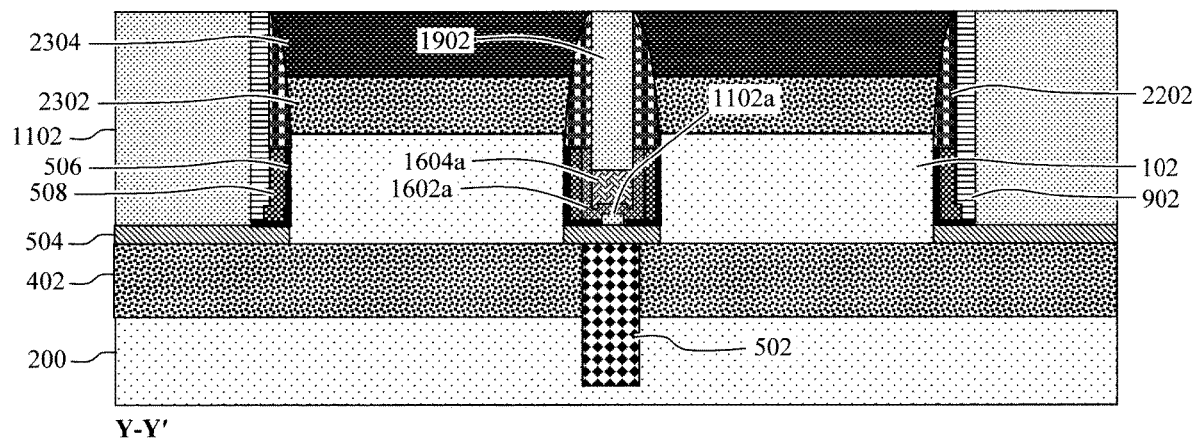
FIG. 23B is a Y-Y' cross-sectional view illustrating the top source/drain regions having been formed in the trenches at the tops of the fins in between the top spacers and dielectric caps having been formed on the top source/drain regions according to an embodiment of the present invention.
Figure 24A:
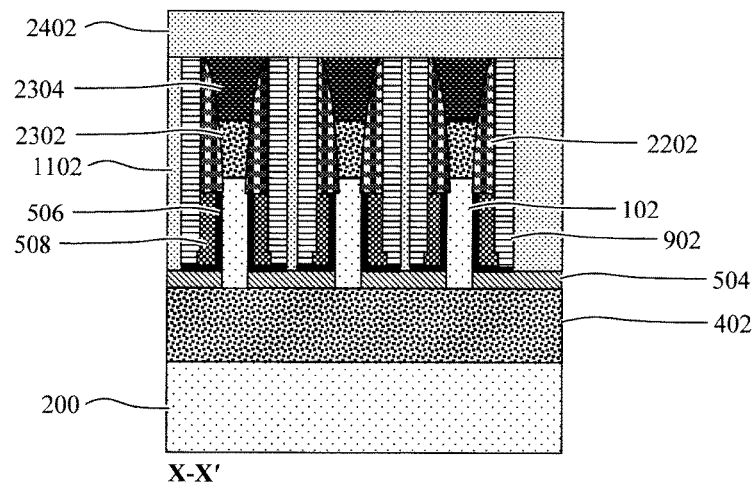
FIG. 24A is an X-X' cross-sectional view illustrating a (third) ILD having been deposited over the first/second ILD and the dielectric caps, and bottom source/drain contact trenches and a gate contact trench having been patterned in the first/second/third ILD.
Figure 24B:
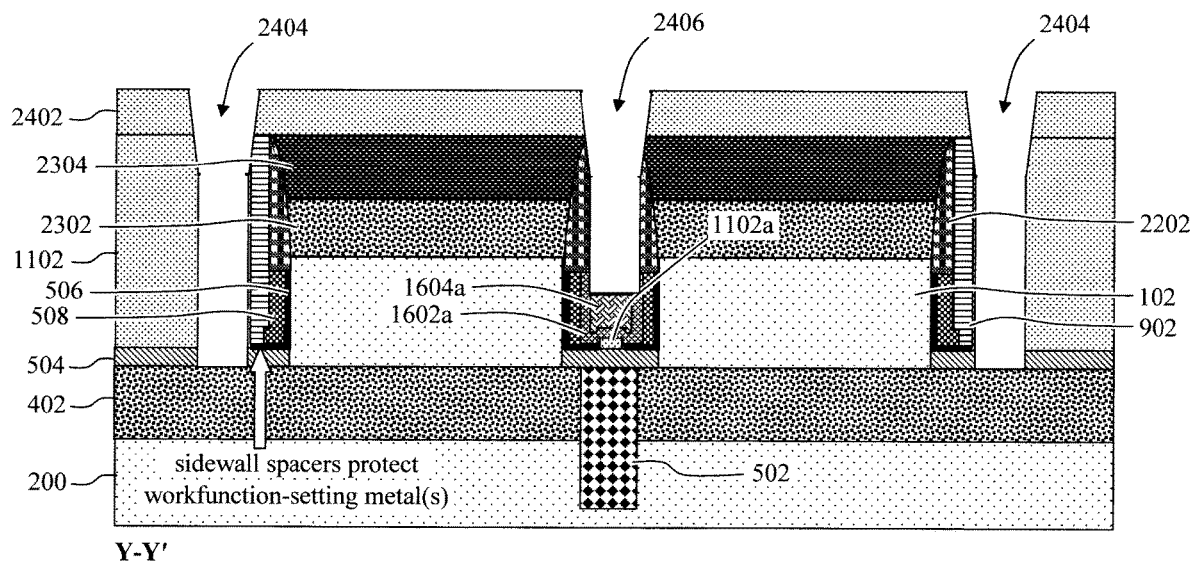
FIG. 24B is a Y-Y' cross-sectional view illustrating the third ILD having been deposited over the first/second ILD and the dielectric caps, and the bottom source/drain contact trenches and the gate contact trench having been patterned in the first/second/third ILD according to an embodiment of the present invention.
Figure 25A:
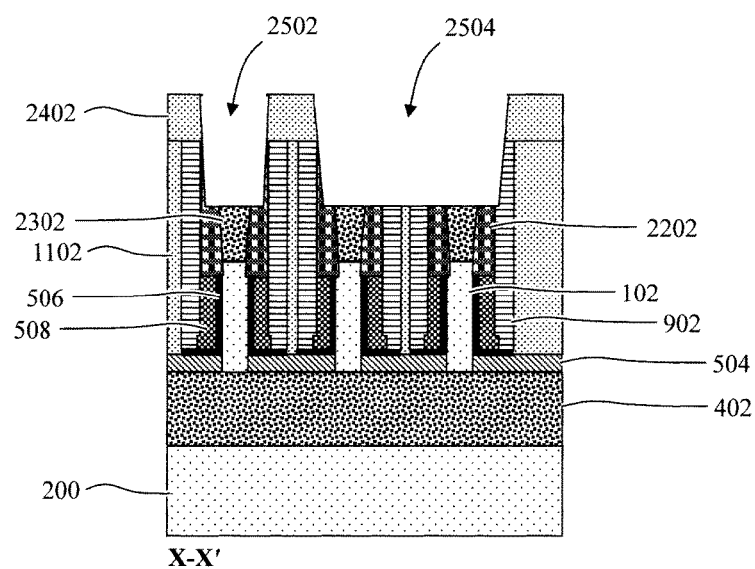
FIG. 25A is an X-X' cross-sectional view illustrating top source/drain contact trenches having been patterned in the third ILD and dielectric caps.
Figure 25B:
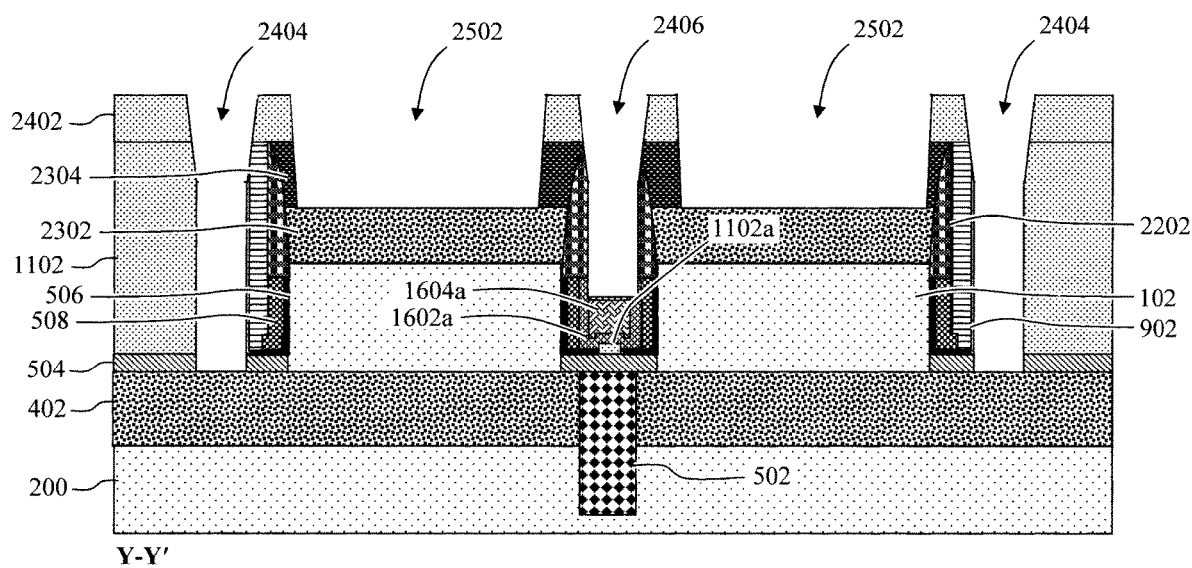
FIG. 25B is a Y-Y' cross-sectional view illustrating the top source/drain contact trenches having been patterned in the third ILD and dielectric caps according to an embodiment of the present invention.

Namely, top source/drain regions 2302 are then formed in the trenches 2002 at the tops of the fins 102, in between the top spacers 2202. See FIG. 23A (an X-X' cross-sectional view) and FIG. 23B (a Y-Y' cross-sectional view). According to an exemplary embodiment, the top source/drain regions 2302 are formed from an in-situ doped (i.e., where a dopant(s) is introduced during growth) or ex-situ doped (e.g., where a dopant(s) is introduced by ion implantation) epitaxial material such as epitaxial Si, epitaxial SiGe, etc. grown at the tops of the fins 102. As provided above, suitable n-type dopants include, but are not limited to, P and/or As, and suitable p-type dopants include, but are not limited to, B. Epitaxial growth of the top source/drain regions 2302 occurs only from the exposed (top) surfaces of the fins 102. Thus, the growth time can be regulated to only partially fill the trenches 2002 as shown in FIGS. 23A and 23B.

Dielectric caps 2304 are then formed on the top source/drain regions 2302. Suitable materials for the dielectric caps 2304 include, but are not limited to, oxide materials such as SiOx and/or SiOC and/or nitride materials such as SiN, SiBN, SiBCN and/or SiOCN, which can be deposited using a process such as CVD, ALD or PVD. The as-deposited dielectric cap material can then be polished using a process such as CMP. The dielectric caps 2304 will serve to protect the underlying source/drain regions 2302 during formation of the bottom source/drain region and gate contacts (see below).

As provided above, the present techniques can advantageously be implemented to form self-aligned gate and source/drain region contacts. To do so, it is preferable that the sidewall spacers 902, the top spacers 2202, and the dielectric caps 2304 are all formed from a material(s) that provides etch selectivity relative to the ILD 1102/1902. For instance, by way of example only, according to an exemplary embodiment ILD 1102 and ILD 1902 are each formed from an oxide material (suitable oxide materials for the ILD 1102 and ILD 1902 were provided above), and the sidewall spacers 902, the top spacers 2202, and the dielectric caps 2304 are each formed from a nitride material. Suitable oxide materials for the ILD 1102 and ILD 1902 and suitable nitride materials for the sidewall spacers 902, the top spacers 2202, and the dielectric caps 2304 were provided above. That way, contact trenches to the bottom source/drain regions 402 and recessed gate extension metal(s) 1604a can be patterned in the (oxide) ILD 1102 and ILD 1902, respectively, without risk of shorting to the top source/drain regions 2302 which are protected by the (nitride) dielectric caps 2304, and vice versa.

Self-aligned top and bottom source/drain region and gate contacts are then formed. As provided above, formation of these self-aligned contacts involves the selective patterning of contact trenches in the ILD 1102 and ILD 1902 relative to the sidewall spacers 902, the top spacers 2202, and the dielectric caps 2304, and vice versa. The order in which the contact trenches are patterned is immaterial. Namely, in the following description, bottom source/drain region and gate contact trenches are first patterned in the ILD 1102 and ILD 1902, followed by the patterning of top source/drain region contact trenches in the dielectric caps 2304. However, the sequence of this process flow is completely arbitrary, and formation of the contact trenches can be performed in any order.

First, an ILD 2402 is deposited over the ILD 1102/1902 and the dielectric caps 2304. See FIG. 24A (an X-X' cross-sectional view) and FIG. 24B (a Y-Y' cross-sectional view). For clarity, the term 'third' may also be used herein when referring to ILD 2402 so as to distinguish it from the 'first' ILD 1102 and the 'second' ILD 1902. Suitable ILD 2402 materials include, but are not limited to, oxide materials such as SiOx and/or SiCOH and/or ULK-ILD materials, such as pSiCOH. A process such as CVD, ALD, or PVD can be used to deposit the ILD 2402. Following deposition, the ILD 2402 can be polished using a process such as CMP.

Standard lithography and etching techniques (see above) are then employed to pattern bottom source/drain region contact trenches 2404 and a gate contact trench 2406 in the ILD 2402, and in ILD 1102 and ILD 1902, respectively. By way of example only, when the ILD 1102, ILD 1902 and ILD 2402 are formed from an oxide material, and the sidewall spacers 902, the top spacers 2202, and the dielectric caps 2304 are formed from a nitride material (see above), an oxide-selective etch such as an oxide-selective RIE can be employed to form the bottom source/drain region contact trenches 2404 and gate contact trench 2406. That way, the sidewall spacers 902 in between the bottom source/drain region contact trenches 2404 and the workfunction-setting metal(s) 508 will not be etched thus preventing any risk of a short forming between the gate stacks and the bottom source/drain contacts can be avoided. See FIG. 24B. The bottom source/drain regions 402 and the gate extension metal(s) 1604a are exposed at the bottoms of the contact trenches 2404 and 2406, respectively.

The process can then be repeated to form the top source source/drain region contact trenches. Namely, standard lithography and etching techniques (see above) are employed to pattern top source source/drain region contact trenches 2502 and 2504 in the ILD 2402 and dielectric caps 2304. See FIG. 25A (an X-X' cross-sectional view) and FIG. 25B (a Y-Y' cross-sectional view). By way of example only, when the ILD 2402 is formed from an oxide material, and the dielectric caps 2304 are formed from a nitride material (see above), a series of oxide-selective and nitride-selective (e.g., RIE) etch steps can be used to form the top source source/drain region contact trenches 2502 and 2504. The top source/drain regions 2302 are exposed at the bottoms of the contact trenches 2502 and 2504.

According to an exemplary embodiment, at least one of the top source source/drain region contact trenches 2502 will be used to form an independent top source source/drain region contact. By 'independent' top source source/drain region contact it is meant that the top source source/drain region contact formed in the contact trench(es) 2502 will contact the top source/drain region 2302 of a single VFET. Further, in this example, at least another one of the top source source/drain region contact trenches 2504 will be used to form a shared top source source/drain region contact. By 'shared top source source/drain region contact it is meant that the top source source/drain region contact formed in the contact trench(es) 2504 will contact the top source/drain regions 2302 of multiple VFETs.

The contact trenches 2404, 2406 and 2502/2504 are then filled with a metal or a combination of metals to form bottom source/drain region contacts 2602 (adjacent to the sidewall spacers 902), gate contacts 2604 (in between the adjacent fins 102), and top source source/drain region contacts 2606/2608, respectively. See FIG. 26A (an X-X' cross-sectional view) and FIG. 26B (a Y-Y' cross-sectional view).

As shown in magnified views 2600, 2600' and 2600", according to an exemplary embodiment, the bottom source/drain region contacts 2602, gate contacts 2604, and top source source/drain region contacts 2606/2608 each includes a silicide liner 2610 lining the contact trenches 2404, 2406 and 2502/2504, respectively, an adhesion/barrier layer 2612 disposed on the silicide liner 2610, and a conductive fill metal 2614 disposed on the adhesion/barrier layer 2612. Suitable materials for the silicide liner 2610 include, but are not limited to, titanium (Ti), nickel (Ni) and/or nickel platinum (NiPt). Suitable materials for the adhesion/barrier layer 2612 include, but are not limited to, tantalum (Ta), TaN, titanium (Ti) and/or TiN. Use of adhesion/barrier layer 2612 helps to prevent diffusion of the metal(s) into the surrounding dielectrics. Suitable conductive fill metals 2614 include, but are not limited to, copper (Cu), tungsten (W), ruthenium (Ru) and/or cobalt (Co). The silicide liner 2610, adhesion/barrier layer 2612 and conductive fill metal 2614 can be deposited into the contact trenches 2404, 2406 and 2502/2504 using a process such as evaporation, sputtering, ALD, CVD or electrochemical plating. Following deposition, the metal overburden can be removed using a process such as CMP. Additionally, a seed layer (not shown) can be deposited into and lining the contact trenches 2404, 2406 and 2502/2504 prior to metal deposition, i.e., to facilitate plating of the metal.

Based on the above-described process, the bottom source/drain region contacts 2602 are in direct contact with the bottom source/drain regions 402, the gate contacts 2604 are in direct contact with the gate extension metal(s) 1604a, and the top source/drain region contacts 2606/2608 are in direct contact with the top source/drain regions 2302. As described above, at least one of the top source/drain region contacts 2606 is an independent top source/drain region contact meaning that it contacts the top source/drain region 2302 of a single VFET. Further, in this example, at least another one of the top source/drain region contacts 2608 is a shared top source source/drain region contact meaning that it contacts the top source/drain regions 2302 of multiple VFETs.

Figure 26A:
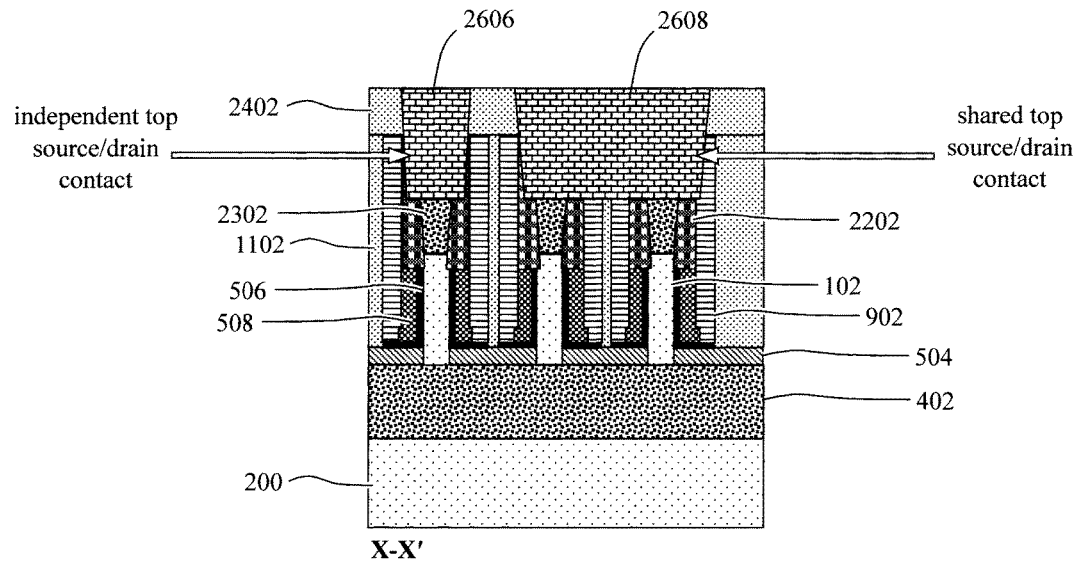
FIG. 26A is an X-X' cross-sectional view illustrating the contact trenches having been filled with a metal(s) to form bottom source/drain region contacts, gate contacts, and top source source/drain region contacts.
Figure 26B:
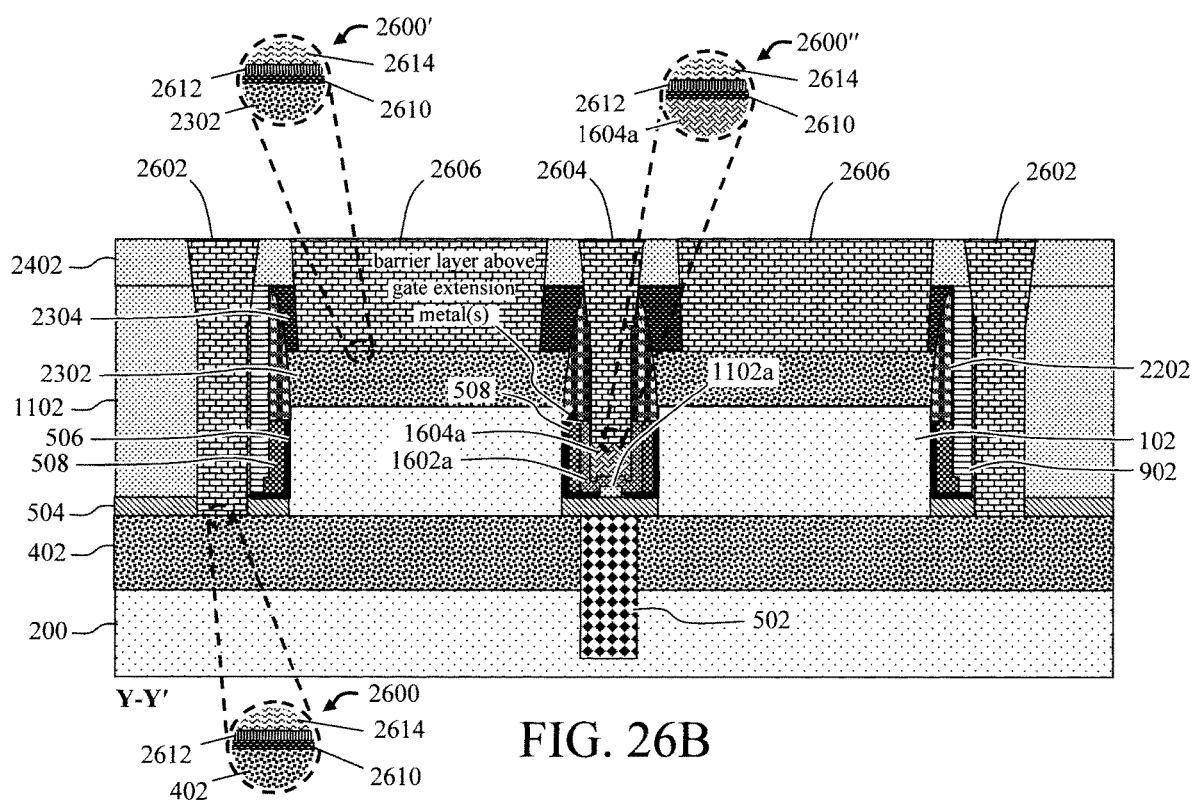
FIG. 26B is a Y-Y' cross-sectional view illustrating the contact trenches having been filled with a metal(s) to form bottom source/drain region contacts, gate contacts, and top source source/drain region contacts according to an embodiment of the present invention.

Some additional unique features of the present VFET device structure are illustrated in FIGS. 26A and 26B. For instance, on one side of the fins 102 the workfunction-setting metal(s) 508 is separated from the bottom source/drain region contacts 2602 by the sidewall spacers 902, while on the other, opposite side of the fins 102 the workfunction-setting metal(s) 508 is separated from the gate extension metal(s) 1604a by the barrier layer 1602a. As provided above, the sidewall spacers 902 are formed from a different material than the barrier layer 1602a. For instance, as provided above, the sidewall spacers 902 can be formed from SiN and/or SiON, whereas the barrier layer 1602a can be formed from Ti, Ta, TiN and/or TaN.

It is further notable that the barrier layer 1602a is present along the bottom and sidewalls of the gate extension metal(s) 1604a. However, as shown for example in FIG. 26B the barrier layer 1602a extends along the sidewall of the workfunction-setting metal(s) 508 with a portion thereof being above the top surface of the gate extension metal(s) 1604a. As a result, the gate contacts 2604 are in direct contact with those portions of the barrier layer 1602a that are above the top surface of the gate extension metal(s) 1604a.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A vertical field-effect transistor (VFET) device, comprising:
   at least one bottom source/drain region present on a substrate;
   at least one fin disposed on the at least one bottom source/drain region, wherein the at least one fin serves as a vertical fin channel of the VFET device;
   a gate stack alongside the at least one fin;
   a gate extension metal adjacent to the gate stack at a base of the at least one fin;
   a barrier layer that separates the gate extension metal from the gate stack, wherein the barrier layer is a conductive material; and
   at least one top source/drain region at a top of the at least one fin.

2. The VFET device of claim 1, wherein the barrier layer comprises a material selected from the group consisting of: titanium (Ti), tantalum (Ta), titanium nitride (TiN), tantalum nitride (TaN), and combinations thereof.

3. The VFET device of claim 1, wherein portions of the barrier layer are present above a top surface of the gate extension metal.

4. The VFET device of claim 1, wherein a top surface of the gate extension metal is below a top surface of the at least one fin.

5. The VFET device of claim 1, wherein the gate stack comprises:
   a gate dielectric disposed along sidewalls of the fins; and
   at least one workfunction-setting metal disposed on the gate dielectric.

6. The VFET device of claim 5, further comprising:
   a bottom source/drain contact in direct contact with the at least one bottom source/drain region; and
   sidewall spacers disposed along the sidewalls of the at least one fin over the gate stack, wherein the sidewall spacers separate the bottom source/drain contact from the at least one workfunction-setting metal.

7. The VFET device of claim 6, wherein the sidewall spacers comprise a different material from the barrier layer.

8. The VFET device of claim 6, wherein the sidewall spacers comprise a material selected from the group consisting of: silicon nitride (SiN), silicon oxynitride (SiON), and combinations thereof.

9. The VFET device of claim 1, further comprising:
   at least one gate contact in direct contact with the gate extension metal.

10. The VFET device of claim 9, wherein the at least one gate contact is in direct contact with portions of the barrier layer that are present above a top surface of the gate extension metal.

11. The VFET device of claim 1, wherein the gate extension metal has a thickness T1, wherein the gate stack has a thickness T2, and wherein T1>T2.

12. The VFET device of claim 1, wherein the gate extension metal comprises a metal selected from the group consisting of: tungsten (W), aluminum (Al), and combinations thereof.

13. The VFET device of claim 1, further comprising:
   bottom spacers disposed on the at least one bottom source/drain region, wherein the bottom spacers offset the at least one bottom source/drain region from the gate stack; and
   top spacers at the top of the at least one fin, wherein the top spacers offset the at least one top source/drain region from the gate stack.

14. A vertical field-effect transistor (VFET) device, comprising:
   multiple VFETs present on a substrate, wherein each VFET comprises:
   a bottom source/drain region present on the substrate;
   a fin disposed on the bottom source/drain region, wherein the fin serves as a vertical fin channel of the VFET;
   a gate stack alongside the fin;
   a gate extension metal adjacent to the gate stack at a base of the fin;
   a barrier layer that separates the gate extension metal from the gate stack, wherein the barrier layer comprises a material selected from the group consisting of: titanium (Ti), tantalum (Ta), titanium nitride (TiN), tantalum nitride (TaN), and combinations thereof; and
   a top source/drain region at a top of the fin.

15. The VFET device of claim 14, wherein portions of the barrier layer are present above a top surface of the gate extension metal.

16. The VFET device of claim 14, wherein the gate stack comprises a gate dielectric disposed along sidewalls of the fins, and at least one workfunction-setting metal disposed on the gate dielectric, and wherein the VFET device further comprises:
   a bottom source/drain contact in direct contact with the bottom source/drain region; and
   sidewall spacers disposed along the sidewalls of the fin over the gate stack, wherein the sidewall spacers separate the bottom source/drain contact from the at least one workfunction-setting metal, and wherein the sidewall spacers comprise a different material from the barrier layer.

17. The VFET device of claim 14, further comprising:
   a top source/drain contact in direct contact with the top source/drain region.

18. The VFET device of claim 17, wherein the top source/drain contact is a shared contact that contacts the top source/drain region of more than one of the multiple VFETs.

\* \* \* \* \*